(12) United States Patent
Mizuhashi

(10) Patent No.: US 6,781,919 B2
(45) Date of Patent: Aug. 24, 2004

(54) ADDRESS SELECTION CIRCUIT AND SEMICONDUCTOR MEMORY DEVICE WITH SYNCHRONOUS AND ASYNCHRONOUS ADDRESS SIGNAL PATHS

(75) Inventor: Hiroshi Mizuhashi, Kanagawa (JP)

(73) Assignee: Oki Electric Industry Co., Ltd., Tokyo (JP)

(*) Notice: Subject to any disclaimer, the term of this patent is extended or adjusted under 35 U.S.C. 154(b) by 0 days.

(21) Appl. No.: 10/421,911

(22) Filed: Apr. 24, 2003

(65) Prior Publication Data

US 2004/0047230 A1 Mar. 11, 2004

(30) Foreign Application Priority Data

Sep. 5, 2002 (JP) ........................................ 2002-259881

(51) Int. Cl.[7] ................................................. G11C 8/00
(52) U.S. Cl. .................. 365/233; 365/189.05; 365/194; 365/230.08
(58) Field of Search ............................ 365/233, 189.05, 365/230.08, 194

(56) References Cited

U.S. PATENT DOCUMENTS

| 5,850,368 | A | * | 12/1998 | Ong et al. | ................ 365/238.5 |
| 5,852,585 | A | * | 12/1998 | Koshizuka | ............ 365/230.08 |
| 5,872,742 | A | * | 2/1999 | Kengeri et al. | ............. 365/233 |
| 6,134,180 | A | * | 10/2000 | Kim et al. | ................... 365/233 |
| 6,552,957 | B2 | * | 4/2003 | Yagishita | ..................... 365/233 |

* cited by examiner

Primary Examiner—Son T. Dinh
(74) Attorney, Agent, or Firm—Volentine Francos, PLLC

(57) ABSTRACT

An address selection circuit in a synchronous memory device receives a clock signal and an address signal, passes the received address signal asynchronously from an address input circuit to an address decoder to generate an address selection signal, then uses the same received address signal to generate further address selection signals in synchronization with the clock signal. This scheme enables the address selection signals to be generated more quickly than if all address signal paths were synchronized with the clock signal. In a burst access, even the first address selection signal can be generated relatively quickly.

20 Claims, 13 Drawing Sheets

US 6,781,919 B2

ADDRESS SELECTION CIRCUIT AND SEMICONDUCTOR MEMORY DEVICE WITH SYNCHRONOUS AND ASYNCHRONOUS ADDRESS SIGNAL PATHS

BACKGROUND OF THE INVENTION

1. Field of the Invention

The present invention relates to a synchronous semiconductor memory device such as a synchronous dynamic random-access memory (SDRAM). More particularly, the invention relates to an address selection circuit capable of quickly generating an address selection signal, and to a semiconductor memory device capable of high-speed access, including the first access in a burst access.

2. Description of the Related Art

FIG. 10 shows the structure of a conventional SDRAM, mainly showing the structure of the circuits that generate a column address selection signal from an externally input address signal, and omitting the circuits that generate a row address selection signal and perform data input and output.

The conventional SDRAM in FIG. 10 has six input transistor-transistor-logic buffers (TTL BUF) 10, five latch circuits 11, a mode register (REG) 12, a clock driver 13, a pair of delay circuits 14, 15 for timing control, a command decoder (DEC) 16, a column address counter control clock generator (CLK GEN) 17, a column address (COL ADDR) counter 18, a carry generator (CARRY GEN) 19, a burst length counter 110, a column address pre-decoder (COL ADDR PRE-DEC) 111, a column address decoder (COL ADR DEC) 112, and a memory cell array 113.

The input TTL buffers 10 input a clock signal CLK, a chip select command signal /CS, a row address strobe command signal /RAS, a column address strobe command signal /CAS, a write enable command signal /WE, and an address signal ADD, the slashes indicating signals that are active low. The command signals and the address signal are passed to the latch circuit 11. To indicate that they have been buffered, the signals input to the latch circuits 11 are denoted CSb, RASb, CASb, WEb, and ADD_BUF. The buffered address signal ADD_BUF may be a parallel multiple-bit signal.

FIG. 11A shows the structure of the latch circuits 11, while FIG. 11B indicates the meaning of transistor symbols. For the CASb latch circuit 11, for example, the input signal DIN in FIG. 11A is the CASb signal output from the /CAS input TTL buffer 10 in FIG. 10, the output signal denoted DOUT in FIG. 11A is the signal denoted CASINb in FIG. 10, and the output signal denoted DOUTb in FIG. 11A is the signal denoted CASIN in FIG. 10.

The latch circuit 11 in FIG. 11A comprises inverters 113, 114, 118, 119, 122, 123, 124, 125, n-channel transistors 116, 120, and p-channel transistors 117, 121. Transistors 116 and 117 form a transmission gate TG12; transistors 120 and 121 form a transmission gate TG13. Inverters 118 and 119 form a master latch circuit; inverters 122 and 123 form a slave latch-circuit.

FIG. 12 shows the structure of a one-bit section of the column address counter 18, comprising inverters 126, 127, 130, 131, 134, 135, 139, 140, 143, 144, 145, 146, n-channel transistors 128, 132, 138, 142, p-channel transistors 129, 133, 137, 141, and an exclusive-OR gate 136. Inverters 130 and 131 form a master latch circuit MFF1 for an externally input address bit; inverters 139 and 140 form a master latch circuit MFF for an internally generated address bit; inverters 143 and 144 form a slave latch circuit. Transistors 128 and 129 form a transmission gate TG14; transistors 132 and 133 form a transmission gate TG15. Transistors 137 and 138 form a transmission gate TG16; transistors 141 and 142 form a transmission gate TG17.

Operation of the Conventional SDRAM

FIG. 13 is a timing diagram of the main signals illustrating the operation of the conventional SDRAM in FIG. 10 up to the generation of a column address selection signal. FIG. 13 shows an example of the signal waveforms when the burst length is four and the burst type is sequential. The operation of the conventional SDRAM up to the generation of the column address selection signal will be described below with reference to FIGS. 10–13.

The externally input clock signal CLK passes through the CLK input TTL buffer 10 and is input as a clock signal CLK_BUF to the clock driver 13. The clock driver 13 generates two clock signals with complementary logic at substantially the same time: a signal CLK_BUFD having the same logic as the input clock signal CLK, and a signal CLK_FFb having inverted logic, as shown in FIG. 13. Clock signal CLK_BUFD is input to timing control delay circuit 14, and clock signal CLK_FFb is input to the latch circuits 11.

The clock signal CLK_BUFD input to delay circuit 14 is delayed and becomes a control clock signal CLK_BUFD1 (FIG. 13). This control clock signal CLK_BUFD1 is input to the column address counter control clock generator 17 and the burst length counter 110.

The externally input command signal /CAS passes through the /CAS input TTL buffer 10 and is input as a command signal CASb to the CASb latch circuit 11.

The logic transitions of the externally input command signal /CAS occur at intervals longer than a setup time tSI and hold time tHI from rising edges of the externally input clock signal CLK (FIG. 13). More specifically, the command signal /CAS goes to the Low level earlier than a rising edge of the clock signal CLK by at least the setup time tSI and returns to the High level later than the rising edge of the clock signal CLK by at least the hold time tHI (FIG. 13). The other command signals /CS, /RAS and /WE are also input in this way.

In the CASb latch circuit 11 (FIG. 11A), when clock signal CLK_FFb is High, transmission gate TG12 is switched on and transmission gate TG13 is switched off. In this state, the input command signal CASb (DIN in FIG. 11A) is latched in the master latch circuit formed by inverters 118 and 119. When the externally input clock signal CLK goes to the High level, clock signal CLK_FFb goes to the Low level. In synchronization with the falling edge of clock signal CLK_FFb, transmission gate TG12 switches off and transmission gate TG13 switches on, so the command signal CASb is latched in the slave latch circuit formed by inverters 122 and 123 and becomes the output command signal CASIN (DOUTb in FIG. 11A) and its inverted logic signal CASINb (DOUT in FIG. 11A), which are input to the command decoder 16.

The command signals CASIN and CASINb are held and output continuously from the CASB latch circuit 11 until the next falling edge of clock signal CLK_FFb.

The command signals CASIN and CASINb are thus output continuously from the CASb latch circuit 11, starting slightly after the first rising edge of the externally input clock signal CLK after input of the external command signal /CAS begins, and continuing until slightly after the next rising edge of the externally input clock signal CLK. For example, CASIN goes to the High level following a rising edge of the externally input clock signal CLK, and goes to the Low level following the next rising edge of the externally input clock signal CLK, as shown in FIG. 13. The CSb, RASb, and WEb latch circuits 11 also operate in this way when command signals CSb, RASb, and WEb are input.

The command decoder 16 decodes the signals CSIN and CSINb received from the CSb latch circuit 11, the signals RASIN and RASINb received from the RASb latch circuit 11, the signals CASIN and CASINb received from the CASb latch circuit 11, and the signals WEIN and WEINb received from the WEb latch circuit 11, and outputs control signals RAS_CL, WE_CL, PRE_CL, MOD_CL, and CAS_CL. The SDRAM thereby enters an operating mode responsive to the command given by the input command signals /CS, /RAS, /CAS, and /WE.

Control signal MOD_CL goes High when a mode register command is input. Control signal RAS_CL goes High when a row active command is input. Control signal CAS_CL goes High when a read command is input. Control signals CAS_CL and WE_CL both go High when a write command is input. Control signal PRE_CL goes High when a precharge command is input. In FIG. 13, since control signal CAS_CL goes High, the SDRAM enters the read or write command operation mode.

Since the logic transitions of control signal CAS_CL occur in synchronization with the command signals CASIN and CASINb output from the CASb latch circuit 11, control signal CAS_CL goes High following the first rising edge of the externally input clock signal CLK and goes Low following the next rising edge of the externally input clock signal CLK, as shown in FIG. 13.

The externally input address signal ADD is received in the same way as the externally input command signal /CAS, passing through the address input TTL buffer 10 and being input as an address signal ADD_BUF to the ADD_BUF latch circuit 11.

The logic transitions of the externally input address signal ADD, like the logic transitions of the externally input command signal /CAS, occur at intervals longer than a setup time tSI and hold time tHI from rising edges of the externally input clock signal CLK (FIG. 13). More specifically, each bit of the address signal ADD goes to the High or Low level earlier than a rising edge of the clock signal CLK by at least the setup time tSI, and remains at that High or Low level for at least the hold time tHI from that rising edge of the clock signal CLK (FIG. 13).

In the ADD_BUF latch circuit 11 (FIG. 11A), when clock signal CLK_FFb is High, transmission gate TG12 is switched on and transmission gate TG13 is switched off. In this state, the input address signal ADD_BUF (DIN in FIG. 11A), like the command signal CASB, is latched in the master latch circuit formed by inverters 118 and 119. When the externally input clock signal CLK goes High, clock signal CLK_FFb goes Low. The address signal ADD_BUF is latched in the slave latch circuit formed by inverters 122 and 123 in synchronization with the falling edge of clock signal CLK_FFb, and becomes the output address signal AIN (DOUT in FIG. 11A), which is input to the column address counter 18 and the mode register 12.

The address signal AIN is held and output continuously from the ADD_BUF latch circuit 11 until the next falling edge of clock signal CLK_FFb.

The address signal AIN is thus output continuously from the ADD_BUF latch circuit 11, starting slightly after the first rising edge of the externally input clock signal CLK after input of the external address signal ADD begins, and continuing until slightly after the next rising edge of the externally input clock signal CLK. In FIG. 13, for example, AIN assumes a certain value AIN(i) in synchronization with a rising edge of the externally input clock signal CLK, and retains that value until the next rising edge of the externally input clock signal CLK.

The mode register 12 generates a Burst Type signal and a Burst Length signal. The Burst Type signal is input to the carry generator 19; the Burst Length signal is input to the carry generator 19 and the burst length counter 110. The burst length counter 110 generates a burst control signal (denoted BURST), which is input to the column address counter control clock generator 17.

The burst control signal (BURST) goes High in synchronization with the rising edge of the CAS_CL control signal, and returns to the Low level after a number of CLK_BUFD1 clock pulses have been counted, the number being given by the burst length set by the Burst Length signal. In FIG. 13, the burst length is four, so four CLK_BUFD1 clock pulses are counted.

The column address counter control clock generator 17 takes the logical AND of the burst control signal (BURST) and clock signal CLK_BUFD1. From the resulting logical AND signal and the CAS_CL control signal, the column address counter control clock generator 17 generates a control clock signal EXT-YCLK for use in generating the first column address selection signal Y-SEL(i) of the burst, and another control clock signal INT-YCLK for use in generating further column address selection signals Y-SEL(i+1), Y-SEL(i+2), and Y-SEL(i+3). The combined number of pulses of the control clock signals EXT-YCLK and INT-YCLK is equal to the length of the burst, e.g., four pulses in FIG. 13. Control clock signals EXT-YCLK and INT-YCLK are input to timing control delay circuit 15, column address counter 18, and carry generator 19.

The control clock signals EXT-YCLK and INT-YCLK are combined and delayed in delay circuit 15 and become a control clock signal YCLKD (FIG. 13), which is input to the column address decoder 112.

In the column address counter 18 (FIG. 12), when the address signal AIN is input from the ADD_BUF latch circuit 11, if the control clock signals EXT-YCLK and INT-YCLK are Low, transmission gates TG14 and TG16 are switched on and transmission gates TG15 and TG17 are switched off. In this state, the input address signal AIN is latched in master latch circuit MFF1. After the externally input clock signal CLK goes High, the control clock signal EXT-YCLK goes High. The address signal AIN is then latched in the slave latch circuit SFF and becomes the first output column address signal AY(i), which is input to the column address pre-decoder 111. The column address signal AY(i) is also output to the carry generator 19 and exclusive-OR gate 136 for use in the internal generation of the next column address signal AY(i+1).

The first column address signal AY(i) is thus the address signal AIN(i), which is input to the column address counter 18 from the ADD_BUF latch circuit 11 in synchronization with clock signal CLK_FFb, and output from the column address counter 18 in synchronization with control clock signal EXT-YCLK, as shown in FIG. 13.

In the conventional SDRAM, the address signal AIN(i), which is output from the ADD_BUF latch circuit 11 in synchronization with clock signal CLK_FFb, is latched in the column address counter 18 and output from the column address counter 18 in synchronization with the rising edge of the EXT-YCLK control clock signal, as described above. The column address counter control clock generator 17 generates the EXT-YCLK control clock signal by using the CLK_BUFD1 clock signal, which is delayed from clock signal CLK_BUFD by timing control delay circuit 14. This delay provides the column address counter 18 with a sufficient setup time, indicated as t11 in FIG. 13.

The carry generator 19 generates a carry signal (CARRY) from the first column address signal AY(i), the Burst Type signal, and the Burst Length signal in synchronization with the rising edge of the control clock signal EXT-YCLK input from the column address counter control clock generator 17. The carry signal is input to the column address counter 18 and used for the internal generation of the next column address signal AY(i+1).

The column address pre-decoder 111 pre-decodes the first column address signal AY(i), and sends a pre-decoded column address signal Pre-YADD(i) to the column address decoder 112.

The column address decoder 112 decodes the pre-decoded column address signal Pre-YADD(i) in synchronization with the rising edge of the control clock signal YCLKD input from timing control delay circuit 15, and generates a column address selection signal Y-SEL(i), as shown in FIG. 13, selecting a column of memory cells in the memory cell array 113.

In the column address counter 18 (FIG. 12), when the EXT-YCLK control clock signal is High and the first column address signal AY(i) is output, an internally generated column address signal AY(i+1), which is the logical exclusive-OR (the signal output from exclusive-OR gate 136) of the first column address signal AY(i) and the carry signal (CARRY) generated from column address signal AY(i), is latched in master latch circuit MFF.

When control clock signal EXT-YCLK goes Low, transmission gate TG15 is switched off. The first column address signal AY(i) continues to be held in the slave latch circuit SFF until control clock signal INT-YCLK goes High. In synchronization with the rising edge of control clock signal INT-YCLK, transmission gate TG16 is switched off and transmission gate TG17 is switched on. In this state, the internally generated column address signal AY(i+1) is latched in the slave latch circuit SFF, from which it is output to the column address pre-decoder 111, the carry generator 19, and exclusive-OR gate 136 in the column address counter 18 for use in the internal generation of the next generated column address signal AY(i+2).

The column address pre-decoder 111 pre-decodes the internally generated column address signal AY(i+1), and sends a pre-decoded column address signal Pre-YADD(i+1) to the column address decoder 112.

The column address decoder 112 decodes the pre-decoded column address signal Pre-YADD(i+1) in synchronization with the rising edge of the control clock signal YCLKD input from timing control delay circuit 15, and generates a column address selection signal Y-SEL(i+1) corresponding to the internally generated column address signal AY(i+1), as shown in FIG. 13, to select another column in the memory cell array 113.

The column address counter 18 internally generates and outputs the following column address signals AY(i+2) and AY(i+3) in the same way as column address signal AY(i+1). The column address decoder 112 generates column address selection signals Y-SEL(i+2) and Y-SEL(i+3) corresponding to these column address signals AY(i+2) and AY(i+3).

In the conventional SDRAM, the column address counter. 18 generates column address signals AY in synchronization with rising edges of control clock signals EXT-YCLK and INT-YCLK, and the column address decoder 112 generates the column address selection signal Y-SEL in synchronization with rising edges of control clock signal YCLKD, which is generated by delaying control clock signals EXT-YCLK and INT-YCLK in timing control delay circuit 15. The column address decoder 112 has a setup time requirement, indicated as t12 in FIG. 13; the purpose of delaying clock signal YCLKD with respect to the EXT-YCLK and INT-YCLK clock signals is to satisfy this set-up time requirement.

To summarize, in the conventional SDRAM, the externally input address signal ADD is latched in the ADD_BUF latch circuit 11 in synchronization with the externally input clock signal CLK, and an internal address signal AIN is output; this address signal AIN is latched in the column address counter 18 in synchronization with control clock signals EXT-YCLK and INT-YCLK generated by delaying the clock signal CLK, and a column address signal AY is output; the column address signal AY is decoded in the column address pre-decoder 111 and column address decoder 112 in synchronization with a control clock signal YCLKD generated by delaying control clock signals EXT-YCLK and INT-YCLK, and a column address selection signal Y-SEL is generated. The control clock signals are delayed in order to provide adequate setup times t11 and t12 for the column address counter 18 and the column address decoder 112.

An SDRAM performs high-speed burst access by using pipeline and prefetch techniques. These techniques speed up accesses to the memory cell array after the first access in the burst, but they do not speed up the first access. To provide sufficient time for the first access, the first access is delayed by a certain number of clock cycles with respect to the column address strobe, creating what is known as a CAS latency. SDRAM devices with high clock frequencies require increasingly large CAS latencies. Although the apparent first access time, exclusive of the CAS latency, may be short, the key to true high-speed operation is to obtain rapid first access including the CAS latency, by decreasing the CAS latency.

In the conventional SDRAM, the internal clock signals are successively delayed in order to obtain setup times t11 and t12 and to assure stable internal operation, and the internal circuits operate on the delayed clock signals. If the CAS latency is decreased, these clock signal delays limit the maximum operating frequency and become an obstacle to high-speed operation. Accordingly, in a conventional SDRAM, the problem in achieving high-speed access, including the first access, is how to reduce the delay of the internal clock signals and stabilize internal operations at the same time.

SUMMARY OF THE INVENTION

An object of the present invention is to provide an address selection circuit capable of quickly generating an address selection signal, and a synchronous semiconductor memory device capable of high-speed access, including the first access in a burst access.

The invented address selection circuit receives a clock signal and an address signal, outputs the received address signal directly as a first internal address signal, generates a second internal address signal from the received address signal in synchronization with the clock signal, and generates the address selection signal first from the first internal address signal, then from the second internal address signal. Output of the first internal address signal starts quickly because the first internal address signal is not synchronized to the clock signal. The invented address selection circuit can accordingly generate the address selection signal more quickly than if it relied entirely on synchronous internal address signals, as in the prior art. In a burst access, even the first address selection signal can be generated relatively quickly.

In a preferred embodiment of the invention, the received address signal passes through a first switching element on a first path for output as the first internal address signal. The received address signal is also latched and output through a second switching element on a second path as the second internal address signal. While the address selection signal is being generated from the first internal address signal, the first switching element is switched on and the second switching element is switched off. The first switching element is then switched off and the second switching element is switched on in synchronization with the clock signal, after which the address selection signal is generated from the second internal address signal.

The preferred embodiment also receives a command signal and processes it in a similar fashion, outputting the received command signal directly as a first (asynchronous) internal command signal, and generating a second internal command signal from the received command signal in synchronization with the clock signal. The first and second internal command signals are used to select between the first and second internal address signals.

The received address signal may be latched in synchronization with an internal clock signal that is generated from the received clock signal only while the address signal is being received, to avoid unnecessary latching operations during the later stages of a burst access, when the address signal is not being received.

DETAILED DESCRIPTION OF THE INVENTION

Figure 1:
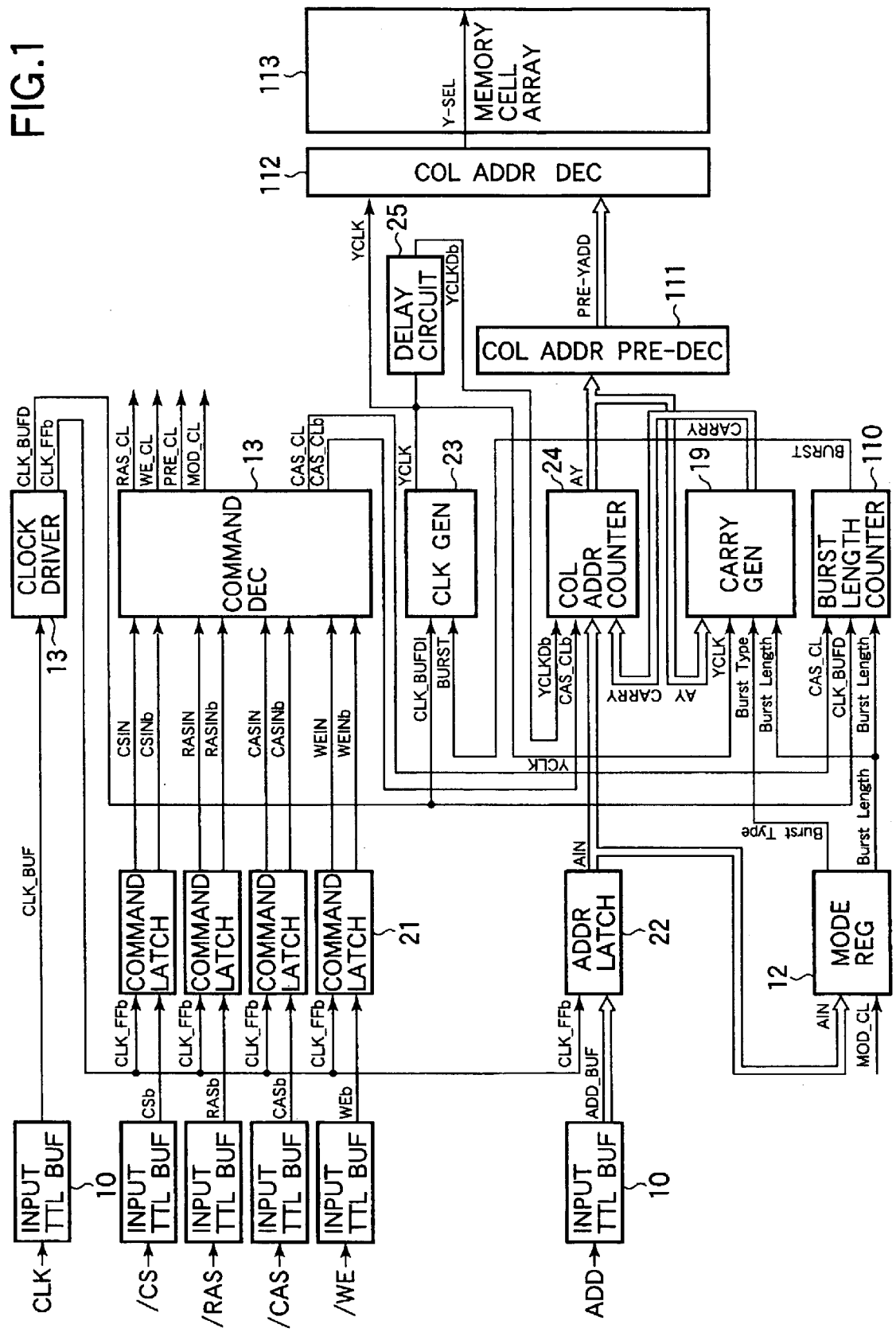
FIG. 1 is a block diagram of an SDRAM according to a first embodiment of the invention.

Embodiments of the invention will now be described with reference to the attached drawings, in which like elements are indicated by like reference characters.

First Embodiment

Figure 10:
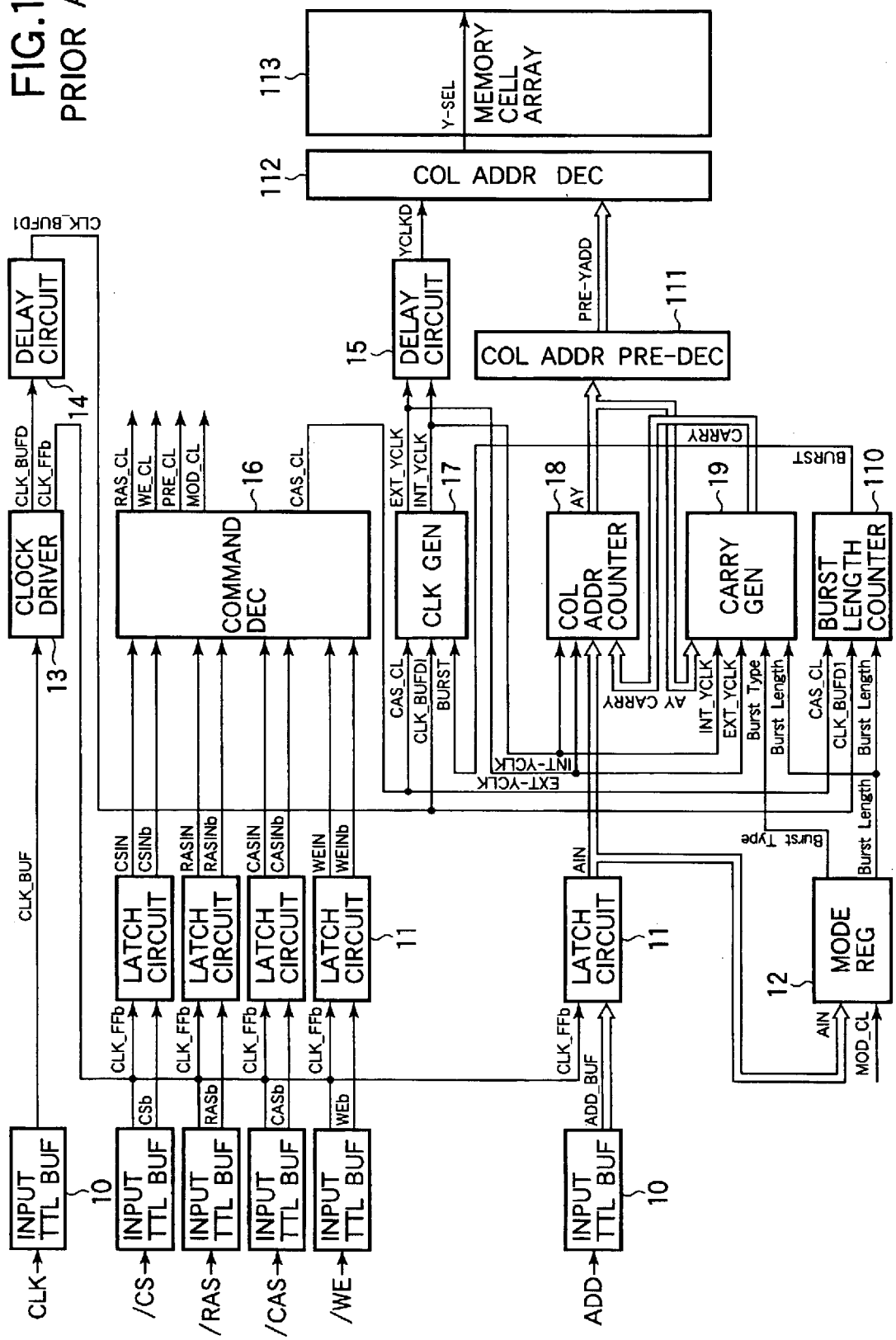
FIG. 10 is a block diagram of a conventional SDRAM.

FIG. 1 shows the structure of an SDRAM according to a first embodiment of the invention, using the same reference characters as in FIG. 10 for similar elements, mainly showing the structure of the circuits that generate a column address selection signal from an externally input address signal, and omitting the circuits that generate a row address selection signal and perform data input and output.

The SDRAM in the first embodiment in FIG. 1 has six input TTL buffers 10, a mode register 12, a clock driver 13, a carry generator 19, four command latch circuits 21, an address latch circuit 22, a column address control clock generator 23, a column address counter 24, a delay circuit 25 for timing control, a command decoder 26, a burst length counter 110, a column address pre-decoder 111, a column address decoder 112, and a memory cell array 113. The same abbreviations are used in FIG. 1 as in FIG. 10.

Input TTL Buffers

The input TTL buffers 10 input a clock signal CLK, a chip select command signal /CS, a row address strobe command signal /RAS, a column address strobe command signal /CAS, a write enable command signal /WE, and an address signal ADD. The four command signals are active Low. The clock signal is passed to the clock driver 13; the command signals are passed to the command latch circuits 21; the address signal is passed to the address latch circuit 22. The buffered signals input to the clock driver 13, the command latch circuits 21, and the address latch circuit 22 are denoted CLK_BUF, CSb, RASb, CASb, WEb, and ADD_BUF, respectively.

The externally input address signal ADD generally includes multiple address bits. If these bits are input in parallel, the SDRAM has a separate address input TTL buffer 10 for each address bit.

Clock Driver

The clock driver 13 inputs the clock signal CLK_BUF from the CLK input TTL buffer 10, outputs a clock signal CLK_BUFD having the same logic as the input clock signal CLK_BUF to the column address control clock generator 23 and the burst length counter 110, and outputs a clock signal CLK_FFb having inverted logic to the CSb command latch circuit 21, the RASb command latch circuit 21, the CASb command latch circuit 21, the WEb command latch circuit 21, and the address latch circuit 22.

The SDRAM in the first embodiment differs from the conventional SDRAM by routing the clock signal CLK_BUFD directly to the column address control clock generator 23 and burst length counter 110, instead of routing it through a timing control delay circuit 14 as in FIG. 10.

Command Latch Circuit

The command signal CSb input from the /CS input TTL buffer 10 is latched in the CSb command latch circuit 21, and a command signal CSIN and an inverted command signal CSINb are output from the CSb command latch circuit 21 to the command decoder 26. CSIN and CSINb have mutually opposite logic, CSIN being active High. Similarly, the command signal RASb input from the /RAS input TTL buffer 10 is latched in the RASb command latch circuit 21, and a command signal RASIN and an inverted command signal RASINb are output from the RASb command latch circuit 21 to the command decoder 26; the command signal CASb input from the /CAS input TTL buffer 10 is latched in the CASb command latch circuit 21, and a command signal CASIN and an inverted command signal CASINb are output from the CASb command latch circuit 21 to the command decoder 26; the command signal WEb input from the /WE input TTL buffer 10 is latched in the WEb command latch circuit 21, and a command signal WEIN and an inverted command signal WEINb are output from the WEb command latch circuit 21 to the command decoder 26.

Figure 2:
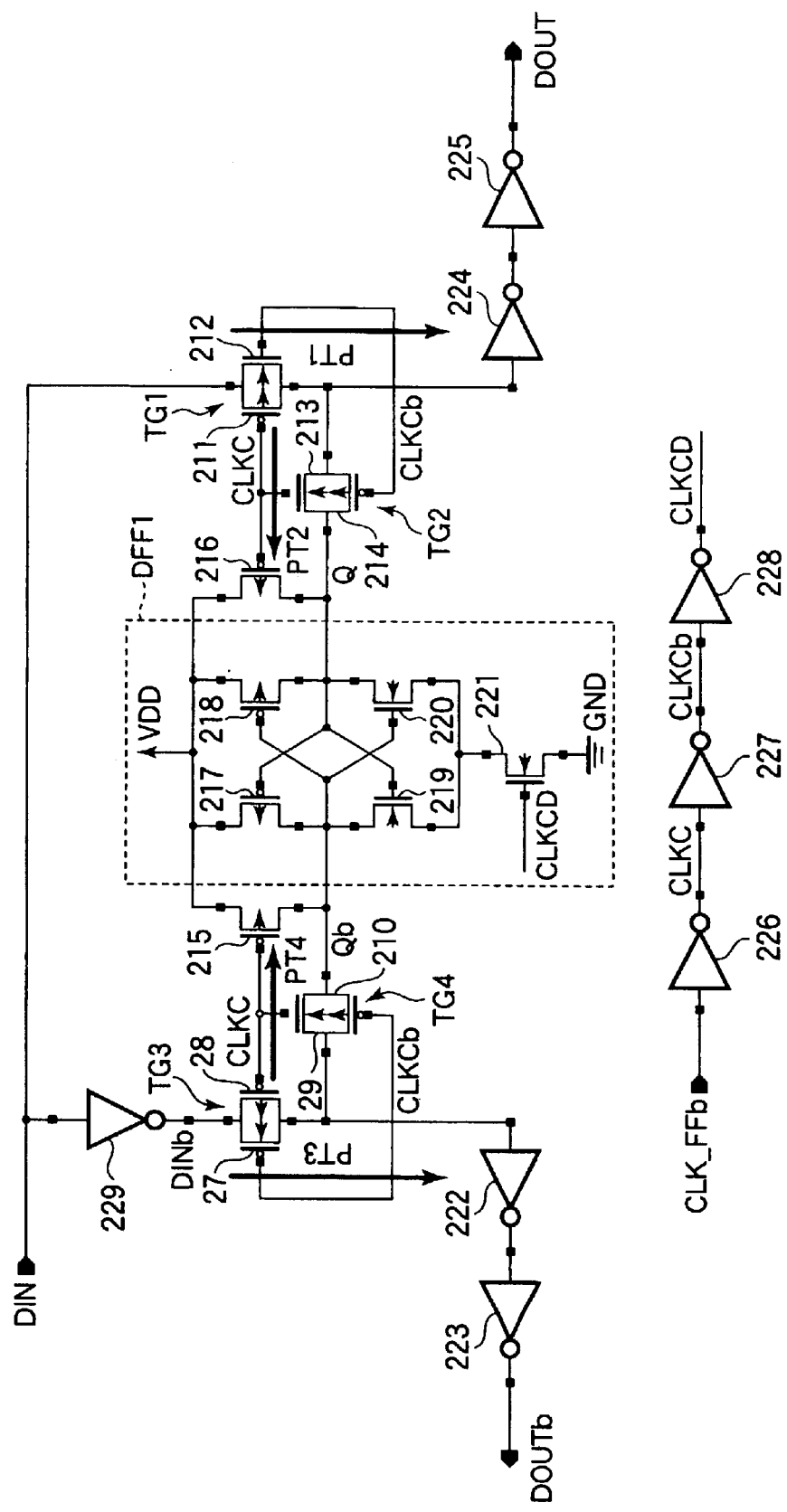
FIG. 2 is a circuit diagram of a command latch circuit in FIG. 1.

FIG. 2 shows the structure of the command latch circuits 21. For the CASb command latch circuit 21, for example, the input signal DIN in FIG. 2 is the CASb signal output from the /CAS input TTL buffer 10 in FIG. 1, the output signal denoted DOUT in FIG. 2 is the signal denoted CASINb in FIG. 1, and the output signal denoted DOUTb in FIG. 2 is the signal denoted CASIN in FIG. 1.

The command latch circuit 21 in FIG. 2 comprises n-channel transistors 27, 29, 212, 213, 219, 220, 221, p-channel transistors 28, 210, 211, 214, 215, 216, 217, 218, and inverters 222, 223, 224, 225, 226, 227, 228, 229.

Transistors 217, 218, 219, 220, and 221 form a differential latch DFF1. Transistors 215 and 216 are pull-up transistors for pre-charging input and output nodes Q and Qb of the differential latch DFF1 to the power supply level (VDD). Transistors 211 and 212 form a transmission gate TG1; transistors 213 and 214 form a transmission gate TG2. Transistors 27 and 28 form a transmission gate TG3; transistors 29 and 210 form a transmission gate TG4.

Clock signal CLK_FFb, which is input from the clock driver 13 to the command latch circuit 21, is inverted by inverter 226 and becomes clock signal CLKC; clock signal CLKC is inverted by inverter 227 and becomes clock signal CLKCb; clock signal CLKCb is inverted by inverter 228 and becomes clock signal CLKCD. Clock signal CLKC is input to the gates of transistors 28, 29, 215, 211, 213, and 216, and controls the switching of these transistors; clock signal CLKCb is input to the gates of transistors 27, 210, 212, and 214, and controls the switching of these transistors; clock signal CLKCD is input to the gate of transistor 221, and controls the switching of this transistor.

Input signal DIN is input to transmission gate TG1 and, inverter 229. The inverted signal DINb output from inverter 229 is input to transmission gate TG3.

The input signal DIN follows either one of two paths PT1 and PT2: on path PT1, input signal DIN passes through transmission gate TG1 and inverters 224, 225 and is output as output signal DOUT; on path PT2, input signal DIN passes through transmission gates TG1 and TG2, and is input to input-output node Q of the differential latch DFF1. The signal output from input-output node Q, which is generated by latching the signal DINb received at input-output node Qb in the differential latch DFF1, passes through transmission gate TG2 and inverters 224, 225, and is output as output signal DOUT.

The inverted input signal DINb follows either one of two paths PT3 and PT4: on,path PT3, signal,DINb passes through transmission gate TG3 and inverters 222, 223 and is output as an inverted output signal DOUTb; on path PT4, signal DINb passes through transmission gates TG3 and TG4, and is input to input-output node Qb of the differential latch DFF1. The signal output from input-output node Qb, which is generated by latching the input signal DIN in the differential latch DFF1, passes through transmission gate TG4 and inverters 222, 223, and is output as DOUTb.

In the command latch circuit 21, when the input clock signal CLK_FFb goes High (slightly after the externally input clock signal CLK goes Low), transmission gates TG1 and TG3 switch on and transmission gates TG2 and TG4 switch off. In this state, input signal DIN becomes output signal DOUT via inverters 224, 225, and the inverted input signal DINb becomes output signal DOUTb via inverters 222, 223. During this time, precharge transistors 216 and 215 precharge the input-output nodes Q and Qb of the differential latch DFF1 to the power supply level VDD.

When the input clock signal CLK_FFb goes Low (slightly after the externally input clock signal CLK goes High), transmission gates TG1 and TG3 switch off, transmission gates TG2 and TG4 switch on, and precharge transistors 216 and 215 switch off, in synchronization with the falling edge of clock signal CLK_FFb. In this state, the input signals DIN, DINb are input to the nodes Q and Qb of the differential latch DFF1. After the switching on of transmission gates TG2 and TG4 has had time to produce a potential difference between nodes Q and Qb, the current source transistor 221 of the differential latch DFF1 is switched on by clock signal CLKCD, and the input signals DIN and DINb are latched in the differential latch DFF1. The signal latched at input-output node Q of the differential latch DFF1 is output through inverters 224 and 225 as output signal DOUT; the signal latched at input-output node Qb is output through inverters 222 and 223 as output signal DOUTb.

When the input clock signal CLK_FFb returns to the High level (slightly after the externally input clock signal CLK goes Low), in synchronization with the rising edge of clock signal CLK_FFb, transmission gates TG1 and TG3 switch on, transmission gates TG2 and TG4 switch off, precharge transistors 216 and 215 switch on, nodes Q and Qb are precharged to the power supply level VDD, and current source, transistor 221 switches off. In this state, the input signals DIN, DINb are output as output signals DOUT and DOUTb without being latched in the differential latch DFF1.

Figure 11A:
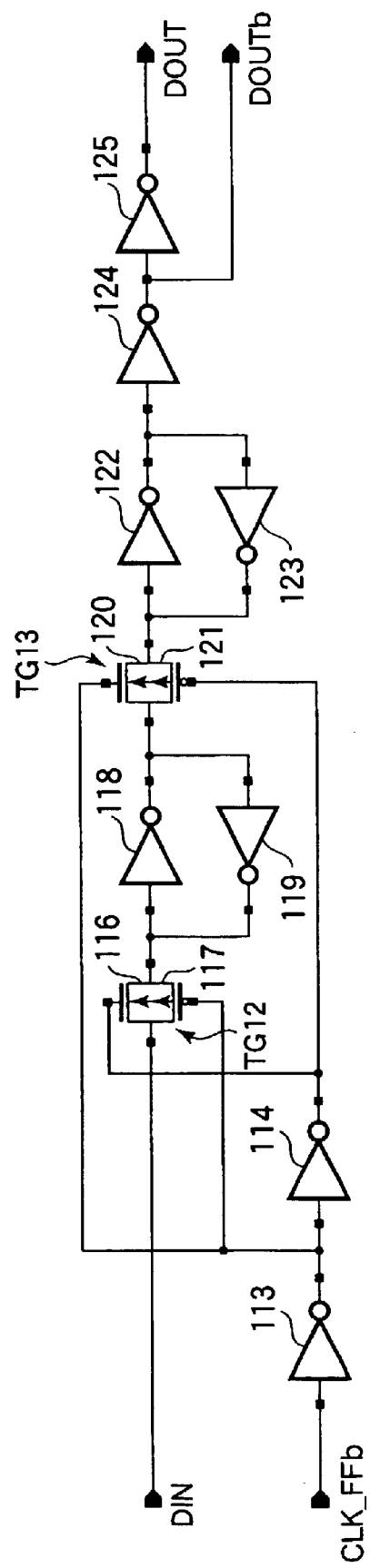
FIG. 11A is a circuit diagram of a latch circuit in FIG. 10.
Figure 11B:
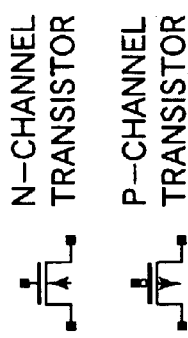
FIG. 11B indicates the meaning of transistor symbols used in the drawings.

As described above, the SDRAM in the first embodiment replaces four of the latch circuits 11 in the conventional SDRAM in FIGS. 10 and 11A with a command latch circuit 21 having two types of signal paths: on paths PT1 and PT3, the input signals DIN and DINb pass directly through transmission gates TG1 and TG3 and are output asynchronously; on paths PT2 and PT4, the input signals DIN and DINb are latched and output in synchronization with the input clock signal CLK_FFb.

The differential latch DFF1, in which the input signals DIN and DINb are latched when transmission gates TG1 and TG3 switch off and transmission gates TG2 and TG4 switch on, provides the command latch circuit 21 with good setup and hold characteristics. The command latch circuit 21 switches between the two forms of output of the signals DOUT and DOUTb without interruption; the input signals DIN and DINb first pass through transmission gates TG1 and TG3 and are output as signals DOUT and DOUTb, then are latched in the differential latch DFF1 and continue to be output as DOUT and DOUTb.

Address Latch Circuit

Figure 3:
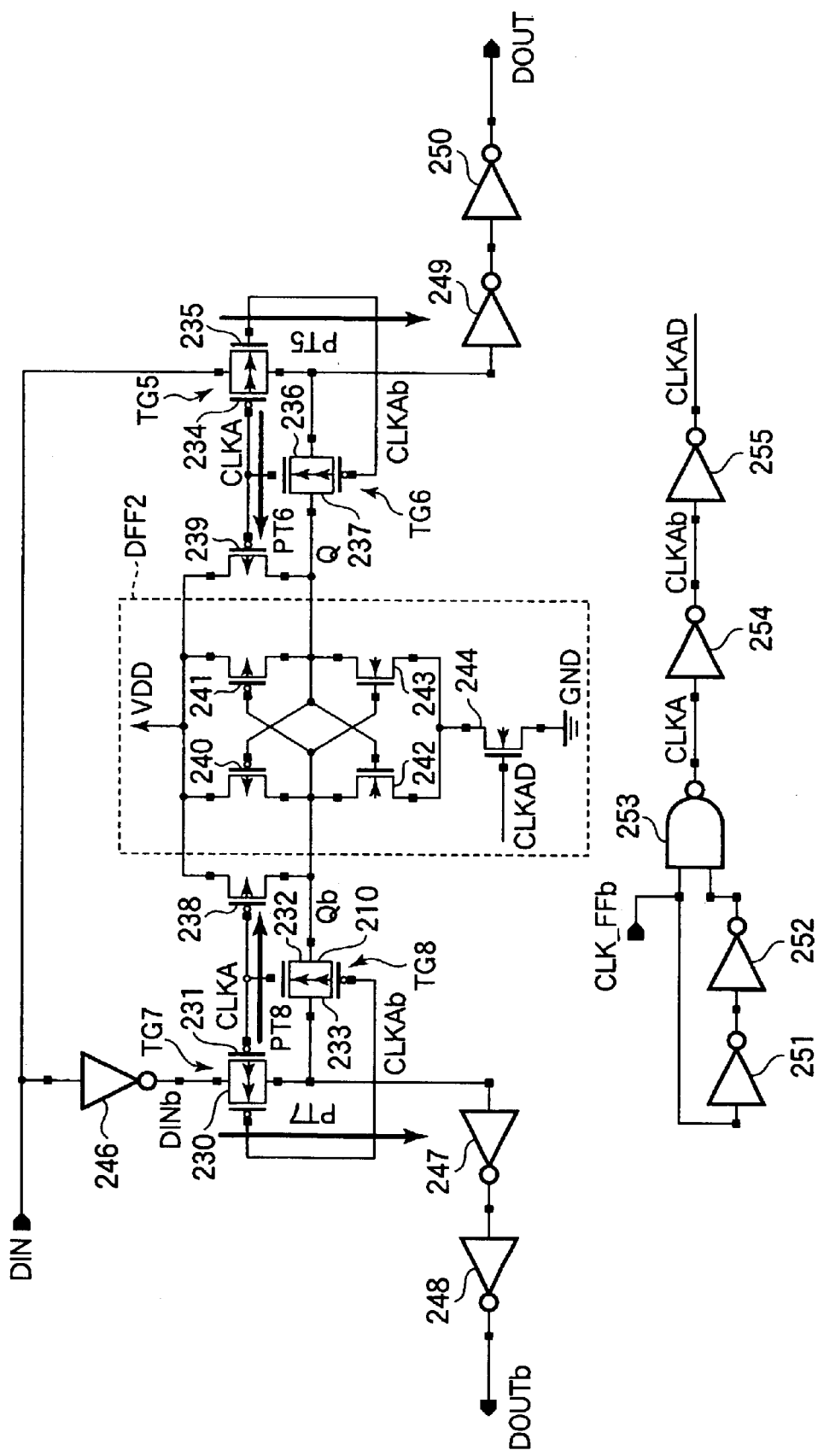
FIG. 3 is a circuit diagram of the address latch circuit in FIG. 1.

The address latch circuit 22 latches the address signal ADD_BUF input from the address input TTL buffer 10, and outputs an address signal AIN from the address latch circuit 22 to the column address counter 24 and the mode register 12. FIG. 3 shows the structure of the address latch circuit 22. The input signal DIN in FIG. 3 is the ADD_BUF signal output from the address input TTL buffer 10 in FIG. 1, the output signal denoted DOUT in FIG. 3 is the signal denoted AIN in FIG. 1, and the output signal denoted DOUTb in FIG. 3 is an inverted version of output signal AIN.

The address latch circuit 22 in FIG. 3 comprises n-channel transistors 230, 232, 235, 236, 242, 243, 244, p-channel transistors 231, 233, 234, 237, 238, 239, 240, 241, inverters 246, 247, 248, 249, 250, 251, 252, 254, 255, and a NAND gate 253.

Transistors 240, 241, 242, 243, and 244 form a differential latch DFF2. Transistors 239 and 238 are pull-up transistors for pre-charging input-output nodes Q and Qb of the differential latch DFF2 to the power supply level VDD. Transistors 234 and 235 form a transmission gate TG5; transistors 236 and 237 form a transmission gate TG6. Transistors 230 and 231 form a transmission gate TG7; transistors 232 and 233 form a transmission gate TG8.

Clock signal CLK_FFb, which is input from the clock driver 13 to the address latch circuit 22, is input to the first input terminal of NAND gate 253, is also input to the second input terminal of NAND gate 253 through inverters 251, 252, and becomes clock signal CLKA; clock signal CLKA is inverted by inverter 254 and becomes clock signal CLKAb; clock signal CLKAb is inverted by inverter 255 and becomes clock signal CLKAD. Clock signal CLKA is input to the gates of transistors 231, 232, 234, 236, 238, and 239, and controls the switching of these transistors; clock signal CLKAb is input to the gates of transistors 230, 233, 235, and 237, and controls the switching of these transistors; clock signal CLKAD is input to the gate of transistor 244, and controls the switching of this transistor.

The address latch circuit 22 differs from the command latch circuit 21 in regard to the circuits (inverters 251, 252, 254, 255 and NAND gate 253) that generate the internally generated clock signals. In the address latch circuit 22, the falling edges of clock signals CLKA and CLKAD and the rising edge of clock signal CLKAb are delayed by inverters 251, 252 and NAND gate 253.

The input address signal ADD_BUF (input signal DIN) is input to transmission gate TG5 and column address counter 246. The inverted address signal ADD_BUF (inverted signal DINb) output from column address counter 246 is input to transmission gate TG7.

The input address signal ADD_BUF follows either one of two paths PT5 and PT6: on path PT5, the input signal ADD_BUF passes through transmission gate TG5 and inverters 249, 250 and is output as an output address signal AIN (output signal DOUT); on path PT6, the input signal ADD_BUF passes through transmission gates TG5 and TG6, and is input to input-output node Q of the differential latch DFF2. The signal output from input-output node Q, which is generated by latching the inverted address signal ADD_BUF received at input-output node Qb in the differential latch DFF2, passes through transmission gate TG6 and inverters 249, 250, and is output as an output address signal AIN (output signal DOUT).

The inverted address signal ADD_BUF (inverted signal DINb) follows either one of two paths PT7 and PT8: on path PT7, signal ADD_BUF passes through transmission gate TG7 and inverters 247, 248 and is output as an inverted output address signal ADD_BUF (inverted output signal DOUTb); on path PT8, signal ADD_BUF passes through transmission gates TG7 and TG8, and is input to input-output node Qb of the differential latch DFF2. The signal output from input-output node Qb, which is generated by latching the address signal ADD_BUF received at input-output node Q in the differential latch DFF2, passes through transmission gate TG8 and inverters 247, 248, and is output as an inverted output address signal ADD_BUF (output signal DOUTb).

In the address latch circuit 22, when the input clock signal CLK_FFb is High (the externally input clock signal CLK is Low), transmission gates TG5 and TG7 switch on and transmission gates TG6 and TG8 switch off. In this state, input address signal ADD_BUF becomes output address signal AIN via inverters 249 and 250. During this time, precharge transistors 239 and 238 precharge the input-output nodes Q and Qb of the differential latch DFF2 to the power supply level VDD.

When the input clock signal CLK_FFb goes to the Low level (slightly after the externally input clock signal CLK goes High), transmission gates TG5 and TG7 switch off, transmission gates TG6 and TG8 switch on, and precharge transistors 238 and 239 switch off in synchronization with the falling edge of clock signal CLK_FFb. In this state, the input address signal ADD_BUF and its inverted address signal ADD_BUF are input to nodes Q and Qb of the differential latch DFF2. After the switching on of transmission gates TG6 and TG8 has had time to produce a potential difference between nodes Q and Qb, the current source transistor 244 of the differential latch DFF2 is switched on by clock signal CLKAD, and the input address signal ADD_BUF and its inverted address signal ADD_BUF are latched in the differential latch DFF2. The signal latched at input-output node Q of the differential latch DFF2 is output through inverters 249 and 250 as output address signal AIN.

When the input clock signal CLK_FFb returns to the High level (slightly after the externally input clock signal CLK goes Low), in synchronization with and lagging a little behind the rising edge of clock signal CLK_FFb, transmission gates TG5 and TG7 switch on, transmission gates TG6 and TG8 switch off, precharge transistors 239 and 238 switch on, nodes Q and Qb are precharged to the power supply level VDD, and current source transistor 244 switches off. In this state, the input address signal ADD_BUF is output as output signal AIN without being latched in the differential latch DFF2.

If the address signal ADD_BUF includes multiple bits input from the address input TTL buffer 10 in parallel, the SDRAM has a separate address latch circuit 22 as shown in FIG. 3 for each address bit.

As described above, the SDRAM in the first embodiment replaces the ADD_BUF latch circuit 11 in the conventional SDRAM in FIG. 10 and FIG. 11A with the address latch circuit 22. Like the command latch circuits 21, the address latch circuit 22 includes two types of signal paths: on paths PT5 and PT7, the input address signal ADD_BUF passes directly through transmission gates TG5 and TG7 and is output asynchronously; on paths PT6 and PT8, the input address signal ADD_BUF is latched in the differential latch DFF2 and is output in synchronization with the input clock signal CLK_FFb.

The differential latch DFF2, in which the input address signal ADD_BUF is latched when transmission gates TG5 and TG7 switch off and transmission gates TG6 and TG8 switch on, provides the address latch circuit 22 with good setup and hold characteristics. The address latch circuit 22 switches between the two forms of output of the address signal AIN without interruption; the input address signal ADD_BUF first passes through transmission gate TG5 and is output as address signal AIN, then is latched in the differential latch DFF2 and continues to be output as AIN.

Command Decoder

The command decoder 26 decodes the input command signals CSb, RASb, CASb, and WEb, and outputs control signals RAS_CL, WE_CL, PRE_CL, MOD_CL, CAS_CL, and CAS_CLb, this last signal being the inverted version of control signal CAS_CL. Control signal MOD_CL is output to the mode register 12, control signal CAS_

CL is output to the burst length counter 110, and control signal CAS_CLb is output to the column address counter 24.

The SDRAM in the first embodiment thus replaces the command decoder 16 in the conventional SDRAM with a command decoder 26 that outputs both control signal CAS_CL and its inverted control signal CAS_CLb.

Mode Register

The mode register 12 receives address signal AIN from the address latch circuit 22 and control signal MOD_CL from the command decoder 26 as inputs, generates a Burst Type signal and a Burst Length signal, outputs the Burst Type signal to the carry generator 19, and outputs the Burst Length signal to the carry generator 19 and the burst length counter 110.

Burst Length Counter

The burst length counter 110 receives control signal CAS_CL, clock signal CLK_BUFD, and the Burst Length signal as inputs, generates a burst control signal (denoted BURST), and outputs the burst control signal to the column address control clock generator 23.

Column Address Control Clock Generator

The column address control clock generator 23 receives clock signal CLK_BUFD and the burst control signal (BURST) as inputs, generates control clock signal YCLK, and outputs the control clock signal YCLK to the carry generator 19, the column address decoder 112, and the timing control delay circuit 25.

The differences from the conventional SDRAM are that control signal CAS_CL is not input to the column address control clock generator 23, only one control clock signal YCLK is output from the column address control clock generator 23, and the control clock signal YCLK is input directly to the column address decoder 112 for use as a clock signal in the generation of column address selection signal Y-SEL, instead of being input through the timing control delay circuit 15 in FIG. 10.

Timing Control Delay Circuit

The timing control delay circuit 25 delays the control clock signal YCLK input from the column address control clock generator 23, inverts its logic, generates a control clock signal YCLKDb, and outputs control clock signal YCLKDb to the column address counter 24.

The differences from the conventional SDRAM are that control clock signals EXT_YCLK and INT_YCLK are replaced with the control signal CAS_CLb output from the command decoder 26 and the control clock signal YCLKDb output from the timing control delay circuit 25 for input to the column address counter 24.

Column Address Counter

The column address counter 24 receives control signal CAS_CLb, control clock signal YCLKDb, address signal AIN, and the carry signal (CARRY) output from the carry generator 19 as inputs, generates a column address signal AY, and outputs the column address signal AY to the column address pre-decoder 111 and the carry generator 19.

In a burst access, a series of column address signals AY are generated for a series of column addresses. The first column address signal AY(i) in the series is generated from the externally input address signal ADD; the following column address signals AY(i+1), AY(i+2), and so on are generated internally. If the externally input address signal ADD includes both column address data and row address data, column address signal AY(i) is generated from the column address data.

Figure 4:
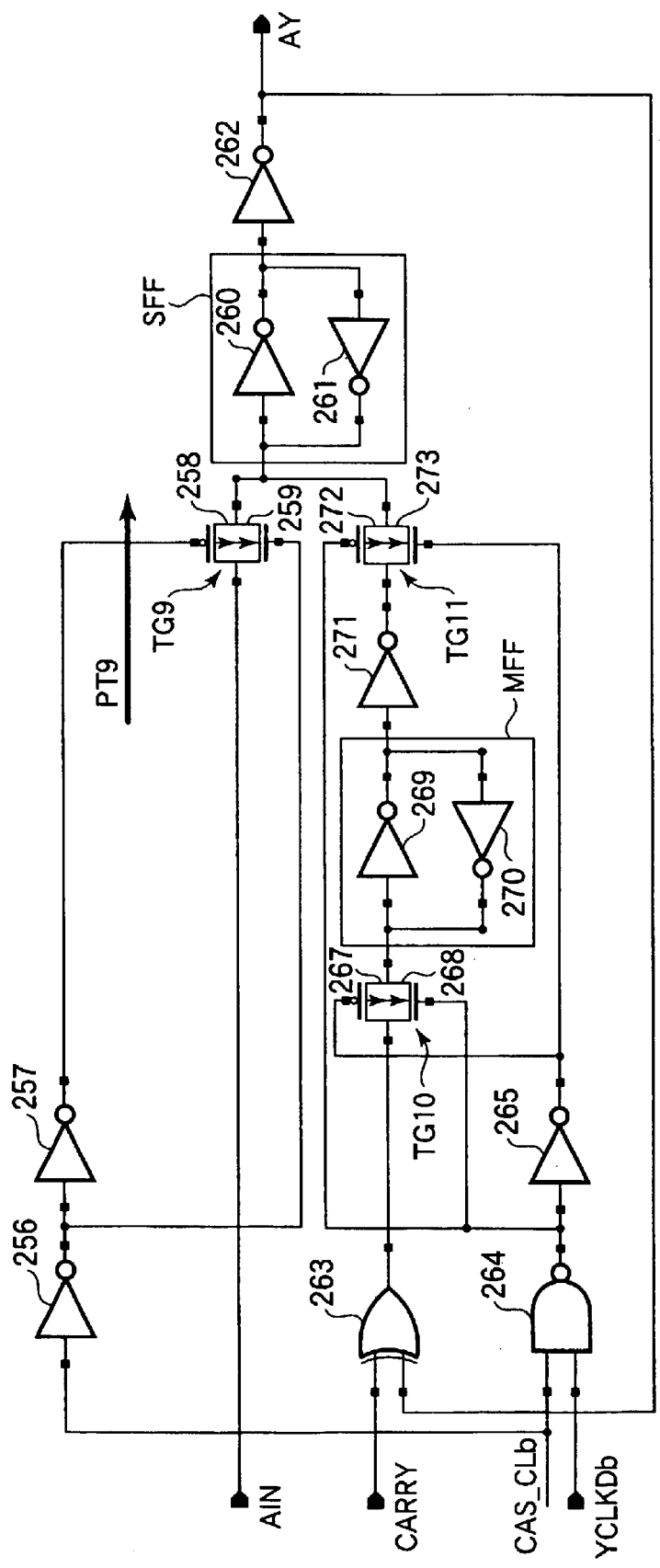
FIG. 4 is a circuit diagram of the column address counter in FIG. 1.

FIG. 4 shows the structure of a one-bit section of the column address counter 24, for generating one bit of the column address signal AY. The one-bit section comprises inverters 256, 257, 260, 261, 262, 265, 269, 270, 271, p-channel transistors 258, 267, 272, n-channel transistors 259, 268, 273, an exclusive-OR gate 263, and a NAND gate 264.

Inverters 269 and 270 form a master latch circuit MFF for an internally generated address bit; inverters 260 and 261 form a slave latch circuit SFF. Transistors 258 and 259 form a transmission gate TG9; transistors 267 and 268 form a transmission gate TG10; transistors 272 and 273 form a transmission gate TG11.

The control signal CAS_CLb from the command decoder 26 is input to the first input terminal of NAND gate 264 and inverter 256, and the control clock signal YCLKDb from the timing control delay circuit 25 is input to the second input terminal of NAND gate 264. The inverted version of control signal CAS_CLb output from inverter 256 is input to inverter 257 and the gate of transistor 259, and controls the switching of this transistor. The twice-inverted version of control signal CAS_CLb output from inverter 257, which has the same logic as CAS_CLb, is input to the gate of transistor 258, and controls the switching of this transistor. The inverted logical AND of control signal CAS_CLb and control clock signal YCLKDb output from NAND gate 264 is inverted by inverter 265, is input to the gates of transistors 268 and 272, and controls the switching of these transistors. The logical AND of control signal CAS_CLb and control clock signal YCLKDb output from inverter 265 is input to the gates of transistors 267 and 273, and controls the switching of these transistors.

Transmission gate TG9, which passes the input address signal AIN to the slave latch circuit SFF, switches on when the input control signal CAS_CLb is Low, and switches off when the input control signal CAS_CLb is High. Transmission gate TG10, which connects the output terminal of exclusive-OR gate 263 to the master latch circuit MFF, switches on when the input control signal CAS_CLb is Low, and switches off when the input control signal CAS_CLb is High, provided the input control clock signal YCLKDb is also High. Transmission gate TG11, which connects the master latch circuit MFF to the slave latch circuit SFF, switches off when the input control signal CAS_CLb is Low, and switches on when the input control signal CAS_CLb is High, provided the input control clock signal YCLKDb is also High.

When transmission gate TG9 is switched on, (one bit of) the input address signal AIN passes through transmission gate TG9, is directly input to the slave latch circuit SFF, and is latched in the slave latch circuit SFF. The input address signal AIN latched in the slave latch circuit SFF is inverted by inverter 262 and output to the column address pre-decoder 111 and the carry generator 19 as one bit of the first column address signal AY(i) in a burst access.

This bit of the column address signal AY(i) is also input to the first input terminal of exclusive-OR gate 263 in the column address counter 24. The carry signal (CARRY) for the next lower-order address bit, which is supplied from the carry generator 19 to the column address counter 24, is input to the second input terminal of exclusive-OR gate 263. Exclusive-OR gate 263 takes the logical exclusive OR of these bits of the column address signal AY(i) and carry signal, and thereby generates (one bit of) the next column address signal AY(i+1) in the series. AY(i+1) is accordingly the bitwise logical exclusive OR of AY(i) and the carry signal.

The bit of column address signal AY(i+1) thus generated is input to transmission gate TG10, latched in the master latch circuit MFF, inverted by inverter 271 and input to transmission gate TG11. When transmission gate TG11 switches on in synchronization with the rising edge of the input control clock signal YCLKDb, the AY(i+1) bit is input to and latched in the slave latch circuit SFF, inverted by inverter 262, and output as one bit of the internally generated column address signal AY(i+1), which is generated by incrementing the first column address signal AY(i).

When the externally input command signal /CAS goes to the High level, the input control signal CAS_CLb goes to the Low level, transmission gates TG9 and TG10 switch on, and transmission gate TG11 switches off. In this state, in the column address counter 24, the input address signal AIN passes directly through transmission gate TG9, the slave latch circuit SFF, and inverter 262 on path PT9, and is output asynchronously as the first column address signal AY(i), rather than being output in synchronization with the clock signal YCLKDb (equivalent to the conventional clock signal EXT-YCL).

When the externally input command signal /CAS goes to the Low level, the input control signal CAS_CLb goes to the High level, and transmission gate TG9 switches off. In this state, the column address counter 24 successively outputs the internally generated column address signals AY(i+1), AY(i+2) and so on in synchronization with rising edges of the input control clock signal YCLKDb (falling edges of the externally input clock signal CLK).

Figure 12:
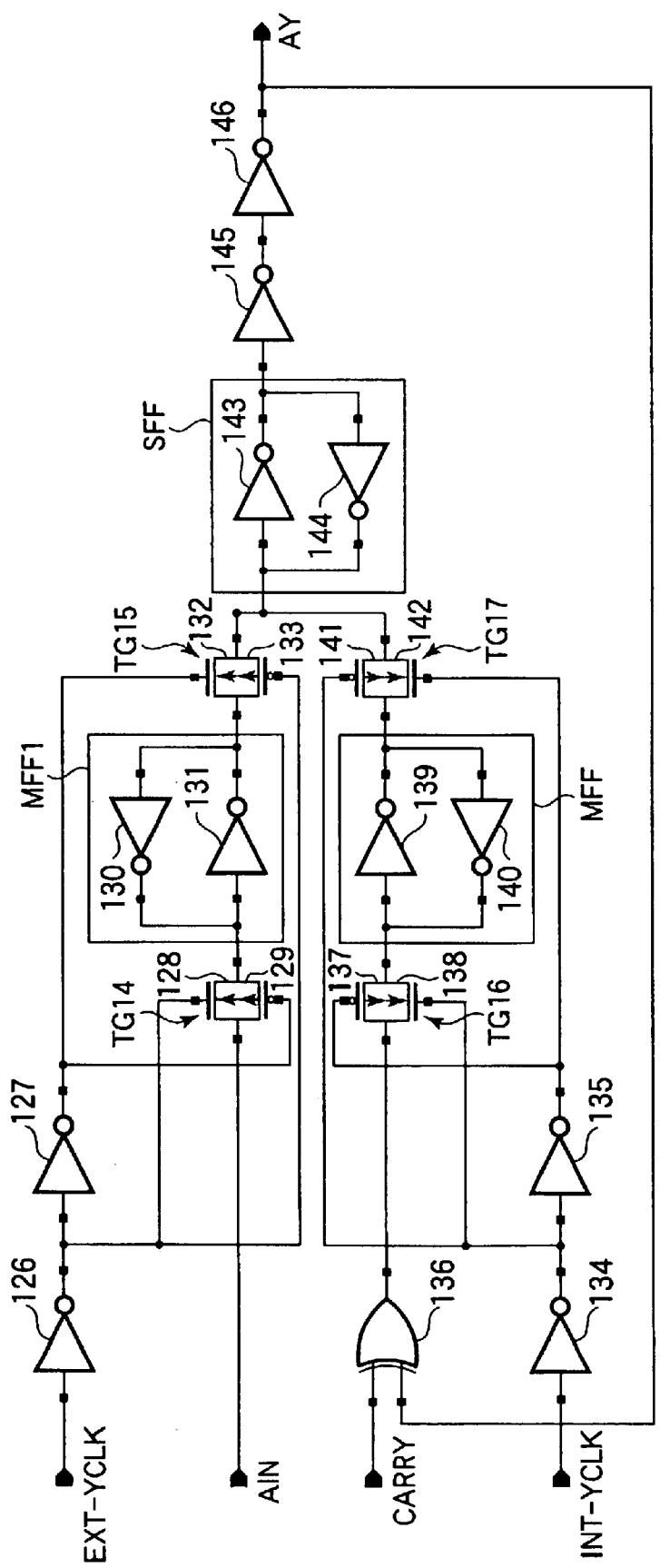
FIG. 12 is a circuit diagram of the column address counter in FIG. 10.

As described above, the SDRAM in the first embodiment replaces the column address counter 18 in the conventional SDRAM in FIG. 10 and FIG. 12 with a column address counter 24 that includes two signal paths: on path PT9, the input address signal AIN passes through transmission gate TG9, slave latch circuit SFF, and inverter 262, and is output as the first column address signal AY(i) in a burst access; on the other path, the second and subsequent column address signals in the burst are generated internally, each being generated from the preceding column address signal and the carry signal, and are successively output as column address signals AY(i+1), AY(i+2), . . . in synchronization with the control clock signal YCLKDb generated by delaying control clock signal YCLK (the externally input clock signal CLK).

Carry Generator

The carry generator 19 receives the Burst Type signal and Burst Length signal from the mode register 12, control clock signal YCLK from the column address control clock generator 23, and column address signal AY from the column address counter 24 as inputs, generates a carry signal for each bit of column address signal AY, and outputs the carry signals to the column address counter 24.

Column Address Pre-decoder

The column address pre-decoder 111 decodes the input column address signal AY, generates a pre-decoded column address signal Pre-YADD, and outputs a pre-decoded signal Pre-YADD to the column address decoder 112.

Column Address Decoder

The column address decoder 112 receives control clock signal YCLK and pre-decoded signal Pre-YADD as inputs, generates a column address selection signal Y-SEL from pre-decoded signal Pre-YADD in synchronization with control clock signal YCLK, outputs a column address selection signal Y-SEL to the memory cell array 113, and thereby selects a column in the memory cell array 113.

Operation of the SDRAM in the First Embodiment

Figure 5:
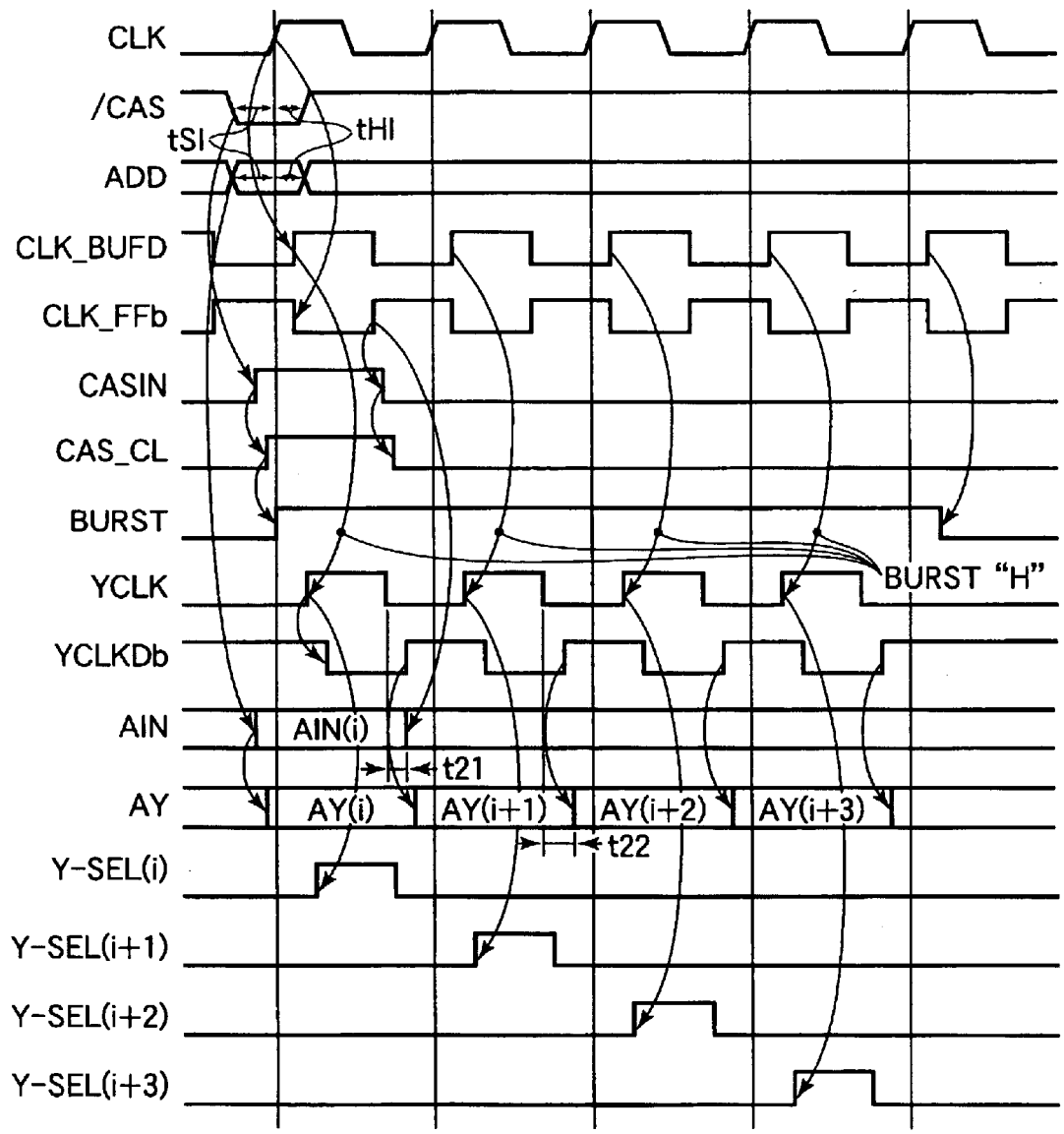
FIG. 5 is a timing diagram of signals illustrating the operation of the SDRAM in FIG. 1.

FIG. 5 is a timing diagram of the main signals illustrating the operation of the SDRAM in the first embodiment in FIG. 1 up to the generation of a column address selection signal.

FIG. 5 shows an example of the signal waveforms when the burst length is four and the burst type is sequential. The operation of the SDRAM up to the generation of the column address selection signal will be described below with reference to FIGS. 1–5.

The externally input clock signal CLK passes through the CLK input TTL buffer 10 and is input as a clock signal CLK_BUF to the clock driver 13. The clock driver 13 generates two clock signals with complementary logic at substantially the same time: a signal CLK_BUFD having the same logic as the input clock signal CLK, and a signal CLK_FFb having inverted logic, as shown in FIG. 5. Clock signal CLK_BUFD is input to the column address counter 24 and the burst length counter 110, and clock signal CLK_FFb is input to the command latch circuit 21 and the address latch circuit 22.

The externally input command signal /CAS passes through the /CAS input TTL buffer 10 and is input as a command signal CASb to the CASb command latch circuit 21.

The logic transitions of the externally input command signal /CAS occur at intervals of a setup time tSI and hold time tHI from rising edges of the externally input clock signal CLK (FIG. 5). More specifically, the command signal /CAS goes to the Low level earlier than a rising edge of the clock signal CLK by the setup time tSI and returns to the High level later than the rising edge of the clock signal CLK by the hold time tHI (FIG. 5). The other command signals /CS, /RAS, and /WE are also input in this way.

In the CASb command latch circuit 21 (FIG. 2), when clock signal CLK_FFb is High, transmission gates TG1 and TG3 switch on. In this state, command signal /CAS passes through transmission gates TG1 and TG3 on paths PT1 and PT3, and becomes the output command signal CASIN (DOUTb in FIG. 2) and its inverted logic signal CASINb (DOUT in FIG. 2), which are input to the command decoder 26.

Following the start of output of command signals CASIN and CASINb due to the passage of the input command signal CASb through transmission gates TG1 and TG3, the externally input clock signal CLK goes to the High level, clock signal CLK_FFb goes to the Low level, transmission gates TG1 and TG3 switch off, and transmission gates TG2 and TG4 switch on, in synchronization with the falling edge of clock signal CLK_FFb. In this state, the input command signal CASb is latched in the differential latch DFF1 on paths PT2 and PT4. The output of command signals CASIN and CASINb continues without interruption despite the switchover from output through transmission gates TG1 and TG3 to output from the differential latch DFF1. During the interval while clock signal CLK_FFb is Low (while the externally input clock signal CLK is High), the output command signals CASIN and CASINb generated from command signal CASb latched in the differential latch DFF1 are input to the command decoder 26.

The command signals CASIN and CASINb are thus output continuously from the CASb command latch circuit 21 from the input of the external command signal /CAS, which goes to the Low level earlier than the rising edge of the externally input clock signal CLK by the setup time tSI, until the falling edge of the externally input clock signal CLK. For example, CASIN goes High in synchronization with the falling edge of the externally input command signal /CAS, and goes Low in synchronization with the next falling edge of the externally input clock signal CLK, as shown in FIG. 5. The CSb, RASb, and WEb command latch circuits 21 also operate in this way when command signals CSb, RASb, and WEb are input.

The command decoder 26 decodes the signals CSIN and CSINb received from the CSb command latch circuit 21, the signals RASIN and RASINb received from the RASb command latch circuit 21, the signals CASIN and CASINb received from the CASb command latch circuit 21, and the signals WEIN and WEINb received from the WEb command latch circuit 21, and thereby outputs control signals RAS_CL, WE_CL, PRE_CL, MOD_CL, CAS_CL, and CAS_CLb. The SDRAM thereby enters an operating mode responsive to the command given by the input command signals /CS, /RAS, /CAS, and /WE.

In FIG. 5, since control signal CAS_CL goes High and control signal CAS_CLb (the inverted version of control signal CAS_CL) goes Low, the SDRAM enters the read or write command operation mode.

Since the logic transitions of control signal CAS_CL occur in synchronization with the command signals CASIN and CASINb output from the CASb command latch circuit 21, control signal CAS_CL goes High in synchronization with the falling edge of the externally input command signal /CAS and goes Low in synchronization with the falling edge of the externally input clock signal CLK, as shown in FIG. 5.

Control signal CAS_CL is input to the burst length counter 110, control signal CAS_CLb is input to the column address counter 24, and control signal MOD_CL is input to the mode register 12. The logic transitions of control signal MOD_CL occur at the same timings as the logic transitions of control signals CAS_CL and CAS_CLb.

The externally input address signal ADD is received in the same way as the externally input command signal /CAS, passing through the address input TTL buffer 10 and being input as an address signal ADD_BUF to the address latch circuit 22.

The logic transitions of the externally input address signal ADD, like the logic transitions of the externally input command signal /CAS, occur at intervals equal to or greater than a setup time tSI and hold time tHI from rising edges of the externally input clock signal CLK (FIG. 5). More specifically, each bit of the address signal ADD goes to the High or Low level earlier than a rising edge of the clock signal CLK by at least the setup time tSI, and remains at that High or Low level for at least the hold time tHI from that rising edge of the clock signal CLK (FIG. 5).

In the address latch circuit 22 (FIG. 3), transmission gates TG5 and TG7 are switched on by clock signal CLK_FFb. In this state, address signal ADD_BUF, like the command signal CASb input to the CASb command latch circuit 21, passes directly through transmission gates TG5 and TG7 on paths PT5 and PT7, and becomes the output address signal AIN (DOUT in FIG. 3), which is input to the column address counter 24 and the mode register 12.

Following the start of output of address signal AIN due to the passage of the input address signal ADD_BUF through transmission gate TG5, the externally input clock signal CLK goes to the High level, clock signal CLK_FFb goes to the Low level, transmission gates TG5 and TG7 switch off, and transmission gates TG4 and TG6 switch on, in synchronization with the falling edge of clock signal CLK_FFb. In this state, the input address signal ADD_BUF is latched in the differential latch DFF2 on paths PT6 and PT8. The output of address signal AIN continues without interruption despite the switchover from output through transmission gate TG5 to output from the differential latch DFF2. During the interval while clock signal CLK_FFb is Low (while the externally input clock signal CLK is High), the address signal AIN output from the differential latch DFF2 is input to the column address counter 24 and the mode register 12.

The address signal AIN is thus output continuously from the address latch circuit 22 from the input of the external address signal ADD, which goes High or Low before the rising edge of the externally input clock signal CLK by the setup time tSI, until the falling edge of the externally input clock signal CLK. Each AIN(i) bit goes High or Low in synchronization with the rising or falling edge of the corresponding bit in the externally input address signal ADD, and remains at the High or Low level until after the next falling edge of the externally input clock signal CLK, as shown in FIG. 5. The disappearance of the AIN(i) signal after the falling edge of the CLK signal is delayed in part by inverters 251, 252 and NAND gate 253 (FIG. 3)

The mode register 12 generates a Burst Type signal and a Burst Length signal. The Burst Type signal is input to the carry generator 19; the Burst Length signal is input to the carry generator 19 and the burst length counter 110.

The burst length counter 110 generates a burst control signal (BURST), which is input to the column address control clock generator 23.

The burst control signal goes High in synchronization with the rising edge of the CAS_CL control signal, and returns to the Low level after a number of CLK_BUFD clock pulses have been counted, the number being given by the burst length set by the Burst Length signal. In FIG. 5, the burst length is four, so four CLK_BUFD clock pulses are counted.

The column address control clock generator 23 takes the logical AND of the burst control signal (BURST) and clock signal CLK_BUFD. The number of pulses of the control clock signal YCLK is equal to the length of the burst, e.g., four pulses in FIG. 5. Control clock signal YCLK is input to the column address decoder 112, the timing control delay circuit 25, and the carry generator 19.

In the timing control delay circuit 25, the control clock signal YCLK is delayed and inverted, and becomes a control clock signal YCLKDb (FIG. 5), which is input to the column address counter 24.

In the column address counter 24 (FIG. 4), when the address signal AIN is input from the address latch circuit 22, if the control signal CAS_CLb is Low, transmission gates TG9 and TG10 are switched on and transmission gate TG11 is switched off. In this state, the address signal AIN is latched in the slave latch circuit SFF on path PT9 and becomes the first output column address signal AY(i), which is input to the column address pre-decoder 111, the carry generator 19, and exclusive-OR gate 263 for use in the generation of the internally generated column address signal AY(i+1).

As shown in FIG. 5, the output of the first column address signal AY(i) starts in synchronization with the transition timing of the externally input address signal ADD, which goes to the High or Low level earlier than the rising edge of the externally input clock signal CLK by the setup time tSI. This is because the externally input address signal ADD is routed through transmission gate TG5 on path PT5 in the address latch circuit 22 to produce address signal AIN, which then passes through transmission gate TG9 on path PT9 in the column address counter 24 to generate address signal AY(i).

Figure 13:
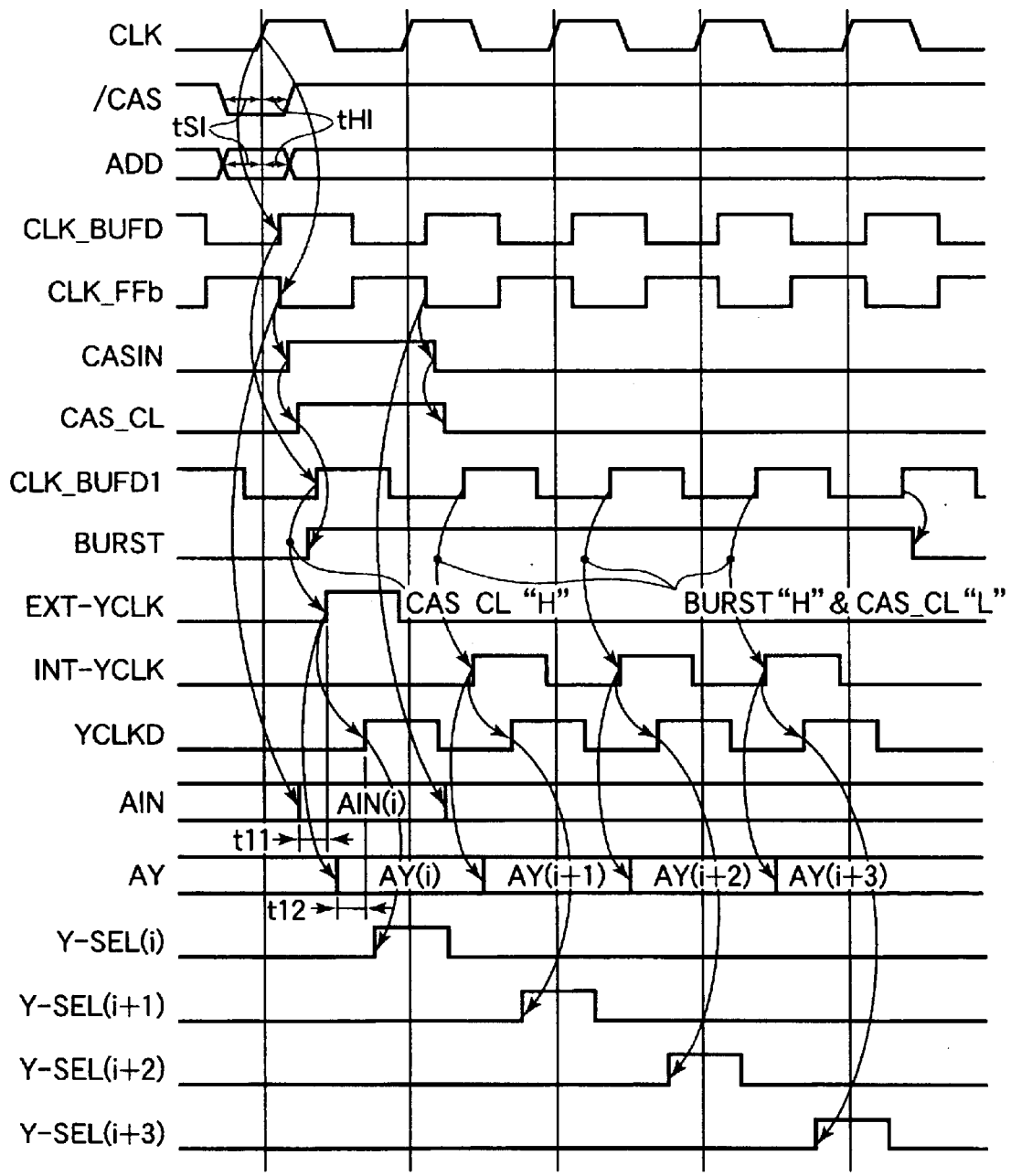
FIG. 13 is a timing diagram of signals illustrating the operation of the conventional SDRAM in FIG. 10.

Accordingly, in the first embodiment, the externally input address signal ADD, which goes to the High or Low level earlier than the rising edge of the externally input clock signal CLK by the setup time tSI, passes directly through the address latch circuit 22, and the address signal AIN(i) generated from the input address signal ADD is input to the column address counter 24 asynchronously, instead of being input in synchronization with the externally input clock signal CLK. The address signal AIN(i) is therefore input to the column address counter 24 earlier than the rising edge of the externally input clock signal CLK (control clock signal YCLK), as shown in FIG. 5, so the setup time t11 (FIG. 13) required by the column address counter 18 in the conventional SDRAM is not needed.

In the first embodiment, the first column address signal AY(i) generated from the address signal AIN(i) is output through the column address counter 24, but the setup time t11 is similarly unnecessary even if the column address counter 24 is replaced with the conventional column address counter 18 (FIG. 10).

The carry generator 19 generates a carry signal (CARRY) for the column address signal AY(i) in synchronization with the rising edge of the control clock signal YCLK input from the column address control clock generator 23, according to the Burst Type signal, the Burst Length signal, and the first column address signal AY(i). The carry signal is input to the column address counter 24 and used for internal generation of the next column address signal AY(i+1).

The column address pre-decoder 111 pre-decodes the first column address signal AY(i), and sends a pre-decoded column address signal Pre-YADD(i) to the column address decoder 112.

The column address decoder 112 decodes the pre-decoded column address signal Pre-YADD(i) in synchronization with the rising edge of the control clock signal YCLK input from the column address control clock generator 23, and generates a column address selection signal Y-SEL(i) for the first column address, as shown in FIG. 5. The column address selection signal Y-SEL(i) selects a column in the memory cell array 113.

As described above, in the first embodiment, the externally input address signal ADD, which goes to the High or Low level earlier than the rising edge of the externally input clock signal CLK by the setup time tSI, passes asynchronously through the address latch circuit 22, the address signal AIN(i) generated from the input address signal ADD passes asynchronously through the column address counter 24, and the first column address signal AY(i) generated from the address signal AIN(i) is input to the column address decoder 112 asynchronously, instead of being input in synchronization with the externally input clock signal CLK. The first column address signal AY(i) is therefore input to the column address decoder 112 earlier than the rising edge of the externally input clock signal CLK (control clock signal YCLK), as shown in FIG. 5. In this state, the column address decoder 112 can generate the column address selection signal Y-SEL in synchronization with the clock signal YCLK generated in the column address control clock generator 23, so the control clock signal YCLK does not need to be input to the column address decoder 112 through a delay circuit for timing control as in the conventional SDRAM (as in FIG. 10), and the setup time t12 (FIG. 13) required by the conventional SDRAM is not needed.

In the first embodiment, the externally input address signal ADD passes through the address latch circuit 22 and the address signal AIN(i) generated from the address signal ADD is output to the column address counter 24, but the setup time t12 is unnecessary even if the address latch circuit 22 is replaced with the conventional ADD_BUF latch circuit 11 (FIG. 10).

In the address latch circuit 22 in the first embodiment, the externally input address signal ADD is latched in the differential latch DFF2 on paths PT6 and PT8 in synchronization with the rising edge of the externally input clock signal CLK, and the address signal ADD is held and output as address signal AIN during the interval while the externally input clock signal CLK is High. A slight delay, however, is ensured by inverters 251 and 252 and NAND gate 253, from the falling edge of the externally input clock signal CLK up to the completion of the holding of the externally input address signal ADD, and the hold time at the differential latch DFF2 is somewhat lengthened, thereby avoiding finishing the holding and output of address signal AIN before transmission gate TG9, through which address signal AIN is output, switches off in the column address counter 24. A margin t21 (FIG. 5) for avoiding selecting multiple column addresses is thus ensured.

In the column address counter 24 (FIG. 4), when the control signal CAS_CLb is Low and the first column address signal AY(i) is output, an internally generated column address signal AY(i+1), which is the logical exclusive OR (the signal output from exclusive-OR gate 263) of the first column address signal AY(i) and the carry signal (CARRY) for the column address signal AY(i), is latched in the master latch circuit MFF.

When the control signal CAS-CLb is High, transmission gate TG9 is switched off. The first column address signal AY(i) continues to be held in the slave latch circuit SFF until the control clock signal YCLKDb (the delayed and inverted version of the control clock signal YCLK) input from the timing control delay circuit 25 goes High, switching off transmission gate TG10 and switching on transmission gate TG11. When transmission gate TG11 is switched on, the internally generated column address signal AY(i+1) is latched in the slave latch circuit SFF, is output to the column address pre-decoder 111, the carry generator 19, and exclusive-OR gate 263 in the column address counter 24, and becomes available for use in the generation of the next internally generated column address signal AY(i+2).

The second column address signal AY(i+1) is output from the column address counter 24 in synchronization with the rising edge of the control clock signal YCLKDb, which is the delayed and inverted version of the control clock signal YCLK, so the transition of the column address signal from the first column address signal AY(i) to the second column address signal AY(i+1) is synchronized with the rising edge of the control clock signal YCLKDb.

The carry generator 19 generates a carry signal (CARRY) for the internally generated column address signal AY(i+1) in synchronization with the rising edge of the control clock signal YCLK input from the column address control clock generator 23, according to the Burst Type signal, the Burst Length signal, and the internally generated column address signal AY(i+1). The carry signal is input to the column address counter 24 and used for the generation of the next internally generated column address signal AY(i+2).

The column address pre-decoder 111 pre-decodes the internally generated column address signal AY(i+1), and sends a pre-decoded column address signal Pre-YADD(i+1) to the column address decoder 112.

The column address decoder 112 decodes the pre-decoded column address signal Pre-YADD(i+1) in synchronization with the rising edge of the control clock signal YCLK input from the column address control clock generator 23, and generates a column address selection signal Y-SEL(i+1) for the internally generated column address signal AY(i+1), as shown in FIG. 5. The internally generated column address selection signal Y-SEL(i+1) selects a column in the memory cell array 113.

The column address counter 24 then successively generates and outputs the internally generated column address signals AY(i+2) and AY(i+3) in the same way as the internally generated column address signal AY(i+1). The column address decoder 112 generates the column address selection signals Y-SEL(i+2) and Y-SEL(i+3) for the internally generated column address signals AY(i+2) and AY(i+3).

As described above, in the first embodiment, the column address control clock generator 23 generates the control clock signal YCLK, the timing control delay circuit 25 generates the control clock signal YCLKDb by delaying and inverting the control clock signal YCLK, and the column address counter 24 is controlled by the control clock signal YCLKDb, so the internally generated column address signals AY(i+1), AY(i+2), and AY(i+3) are successively generated and input to the column address decoder 112 earlier than the rising edge of the control clock signal YCLK. Accordingly, the column address selection signals Y-SEL (i+1), Y-SEL(i+2), and Y-SEL(i+3) can be successively generated in synchronization with the control clock signal YCLK, and the control clock signal YCLK does not need to be input to the column address decoder 112 through a delay circuit for timing control as in the conventional SDRAM (as in FIG. 10).

In the first embodiment, the timing control delay circuit 25 generates the control clock signal YCLKDb by delaying the control clock signal YCLK, which synchronizes the column address selection signal Y-SEL, and the column address counter 24 controls transmission gates TG10 and TG11 for output of the internally generated column address signals AY(i+1), AY(i+2), and AY(i+3) in synchronization with control clock signal YCLKDb, thereby ensuring a margin t22 (FIG. 5) for avoiding selecting multiple column addresses.

As described above, in the first embodiment, the externally input address signal ADD passes asynchronously through the address latch circuit 22 and the column address counter 24, and is input to the column address decoder 112 as the first column address signal AY(i). Accordingly, the first column address signal AY(i) propagates to the column address decoder 112 at high speed asynchronously, without having to wait for a rising edge of the externally input clock signal CLK. The externally input command signal CASb passes through the command latch circuit 21, and the command signals CASIN and CASINb generated from the command signal CASb are input to the command decoder 26. Accordingly, the command signals CASIN and CASINb propagate to the command decoder 26 at high speed asynchronously, without having to wait for the rising edge of the externally input clock signal CLK. As a result, the first column address selection signal Y-SEL(i) in a burst access can be generated quickly, and the entire burst access, including the first access, can take place at high speed.

Use of the differential latches DFF1 and DFF2 provides the command latch circuit 21 and the address latch circuit 22 with good setup and hold characteristics.

The control clock signal YCLK that controls the generation of the column address selection signal Y-SEL in the column address decoder 112 is generated from the externally input clock signal CLK, without the use of a delay circuit for timing control. The control clock signal YCLKDb is generated by delaying and inverting the control clock signal YCLK. The internally generated address signals AY(i+1), AY(i+2), . . . are output from the column address counter 24 in synchronization with rising edges of control clock signal YCLKDb. Accordingly, the internally generated address signals AY(i+1), AY(i+2), . . . are input to the column address decoder 112 well before the column address selection signals Y-SEL(i+1), Y-SEL(i+2), . . . are generated in synchronization with control clock signal YCLK, enabling the second and subsequent column address selection signals Y-SEL(i+1), Y-SEL(i+2), . . . to be generated rapidly in a burst access.

Since a margin t21 is ensured by lengthening the hold time of the address signal ADD at the address latch circuit 22 slightly, and a margin t22 is ensured by using the control clock signal YCLKDb generated by delaying the control clock signal YCLK, which controls the column address decoder 112, stable and error-free circuit operation can be obtained, as shown in FIG. 5.

Second Embodiment

In the first embodiment, address signal AIN(i) (FIG. 5) is input directly to the column address counter 24 from the address latch circuit 22, but control signal CAS_CLb is input to the column address counter 24 from the command latch circuit 21 through the command decoder 26. The externally input address signal ADD and the externally input command signal /CAS, however, are input to the address input TTL buffer 10 and the /CAS input TTL buffer 10 at the same time. Accordingly, the input of the control signal CAS_CLb (the inverted version of the control signal CAS_CL) at the Low level to the column address counter 24 lags behind the input of the address signal AIN(i) to the column address counter. This causes a delay between the input of the address signal AIN(i) to the column address counter 24 and the output of the column address signal AY(i), as shown in FIG. 5. The SDRAM in the second embodiment eliminates this delay in the column address counter and thereby generates column address signals faster.

Figure 6:
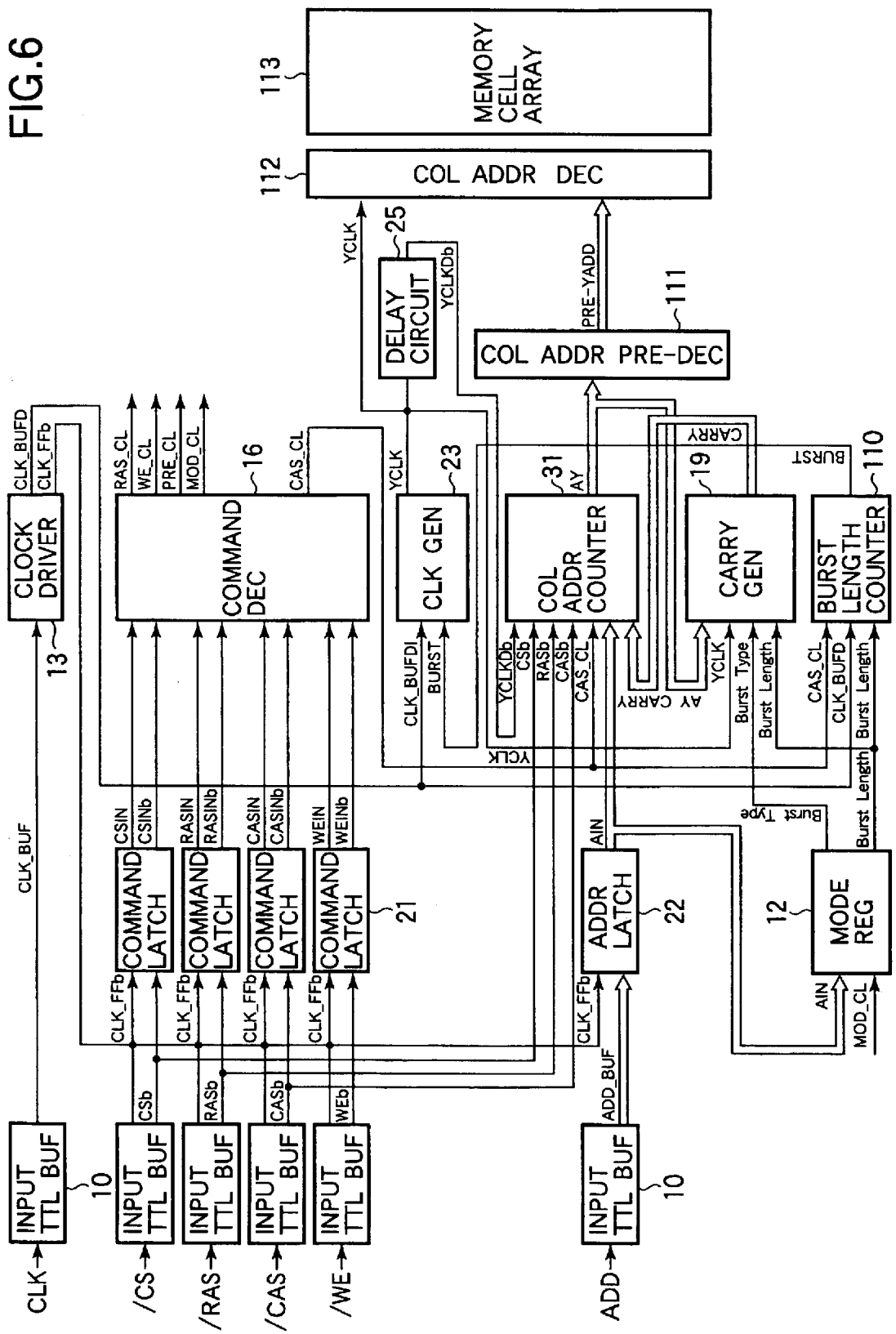
FIG. 6 is a block diagram of an SDRAM according to a second embodiment of the invention.

FIG. 6 shows the structure of an SDRAM according to the second embodiment of the invention, using the same reference characters as in FIGS. 1 and 10 for similar elements, mainly showing the structure of the circuits that generate a column address selection signal from an externally input address signal, and omitting the circuits that generate a row address selection signal and perform data input and output.

The SDRAM in the second embodiment in FIG. 6 has six input TTL buffers 10, a mode register 12, a clock driver 13, a command decoder 16, a carry generator 19, four command latch circuits 21, an address latch circuit 22, a column address control clock generator 23, a delay circuit 25 for timing control, a column address (COL ADDR) counter 31, a burst length counter 110, a column address pre-decoder 111, a column address decoder 112, and a memory cell array 113.

The differences from the SDRAM in the first embodiment (FIG. 1) are that the command decoder 26 is replaced with the conventional command decoder 16 (FIG. 10), and the column address counter 24 is replaced with a different column address counter 31. Column address counter 31 receives command signals CSb, RASb, and CASb from the /CS input TTL buffer 110, /RAS input TTL buffer 10, and /CAS input TTL buffer 10, and receives control signal CAS_CL, instead of control signal CAS_CLb, from the command decoder 16.

In addition to control signal CAS_CL and command signals CSb, RASb, and CASb, the column address counter 31 receives control clock signal YCLKDb, address signal AIN, and the carry signal (CARRY), and generates a column address signal AY, which is output to the column address pre-decoder 111 and the carry generator 19.

Figure 7:
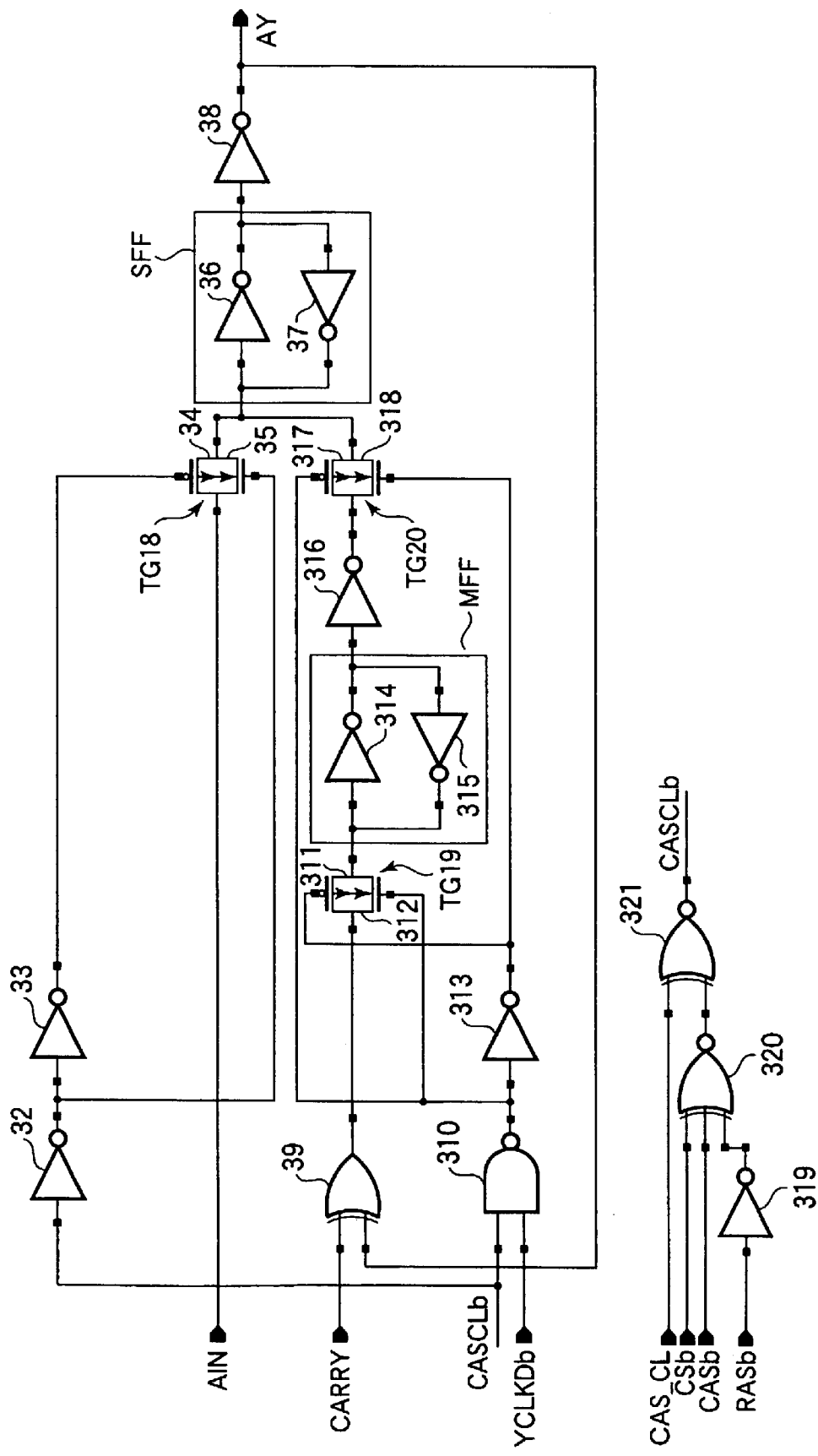
FIG. 7 is a circuit diagram of the column address counter in FIG. 6.

FIG. 7 shows the structure of a one-bit section of the column address counter 31, for generating one bit of the column address signal AY. The one-bit section comprises inverters 32, 33, 36, 37, 38, 313, 314, 315, 316, 319, p-channel transistors 34, 311, 317, n-channel transistors 35, 312, 318, an exclusive-OR gate 39, a NAND gate 310, and a pair of NOR gates 320, 321.

Inverters 314 and 315 form a master latch circuit MFF for an internally generated address bit; inverters 36 and 37 form a slave latch circuit SFF. Transistors 34 and 35 form a transmission gate TG18; transistors 311 and 312 form a transmission gate TG19; transistors 317 and 318 form a transmission gate TG20.

The column address counter 31 in the second embodiment shown in FIG. 7 differs from the column address counter 24 in the first embodiment (FIG. 4) by including a circuit for generating a control signal CASCLb, and by using the control signal CASCLb instead of the control signal CAS__CLb input from the command decoder 26 in the first embodiment. The circuit for generating control signal CAS-CLb comprises inverter 319 and NOR gates 320 and 321.

In the circuit for generating control signal CASCLb, inverter 319 and NOR gate 320 constitute a decoder that receives command signals CSb, RASb, and CASb from the /CS input TTL buffer 10, /RAS input TTL buffer 10, and /CAS input TTL buffer 10.

The first and second input terminals of NOR gate 320 receive command signals CSb and CASb. Inverter 319 inverts command signal RASb. The third input terminal of NOR gate 320 receives the inverted version of command signal RASb from inverter 319. The command signals CSb, CASb, and RASb are thereby decoded, and the decoded signal is output from NOR gate 320.

The first input terminal of NOR gate 321 receives control signal CAS__CL from the command decoder. The second input terminal of NOR gate 321 receives the decoded signal generated from command signals CSb, CASb, and RASb and output from NOR gate 320. NOR gate 321 takes the negated logical OR of control signal CAS__CL and the decoded signal, and outputs the result as control signal CASCLb.

Control signal CASCLb is inverted by inverter 32, and controls the switching of transmission gate TG18. Control signal CASCLb is input to the first input terminal of NAND gate 310, and the negative logical AND of control signal CASCLb and control clock signal YCLKDb controls the switching of transmission gates TG19 and TG20.

As described above, in the second embodiment, the column address counter 31 receives command signals CSb, RASb, and CASb directly from the /CS input TTL buffer 10, the /RAS input TTL buffer 10, and /CAS input TTL buffer 10, decodes the command signals CSb, RASb, and, CASb, generates an internally generated control signal CASCLb, controls transmission gate TG18 by the internally generated control signal CASCLb, and brings transmission gate TG18 into conduction to pass address signal AIN(i).

Since the decoded signal output from the decoder circuit in the column address counter 31 (the signal output from NOR gate 321) goes High earlier than the control signal CAS__CL input from the command decoder 16, and goes High at the same time or earlier than the time when address signal AIN(i) is input from the address latch circuit 22, the decoded signal brings transmission gate TG18 into conduction for the passage of address signal AIN(i) at the same time as or earlier than the input of address signal AIN(i), so there is no delay between the input of address signal AIN(i) and the output of the column address signal AY(i). As a result, the column address signal AY(i) generated from address signal AIN(i), which is generated from the externally input address signal ADD, propagates to the column address decoder 112 faster and the column address selection signal Y-SEL can be generated more quickly than in the first embodiment.

As described above, according to the second embodiment, the column address counter 31 brings transmission gate TG18 in the column address counter 31 into conduction for the passage of address signal AIN(i) by decoding the externally input command signals. Accordingly, the column address signal AY(i) propagates to the column address decoder 112 faster. As a result, the first column address selection signal Y-SEL(i) in a burst access can be generated more quickly, the entire burst access, including the first access, can take place at higher speed, and more stable circuit operation can be obtained.

Third Embodiment

In the address latch circuit 22 in the first and second embodiments, the differential latch DFF2 consumes more current than necessary, because it is driven by clock signal CLK__FFb and performs latch operations at times, such as during the second and subsequent accesses in a burst and in the active standby mode, when there is no externally input address signal ADD to latch. In the third embodiment, this current consumption is reduced, thereby reducing the power consumption of the SDRAM.

Figure 8:
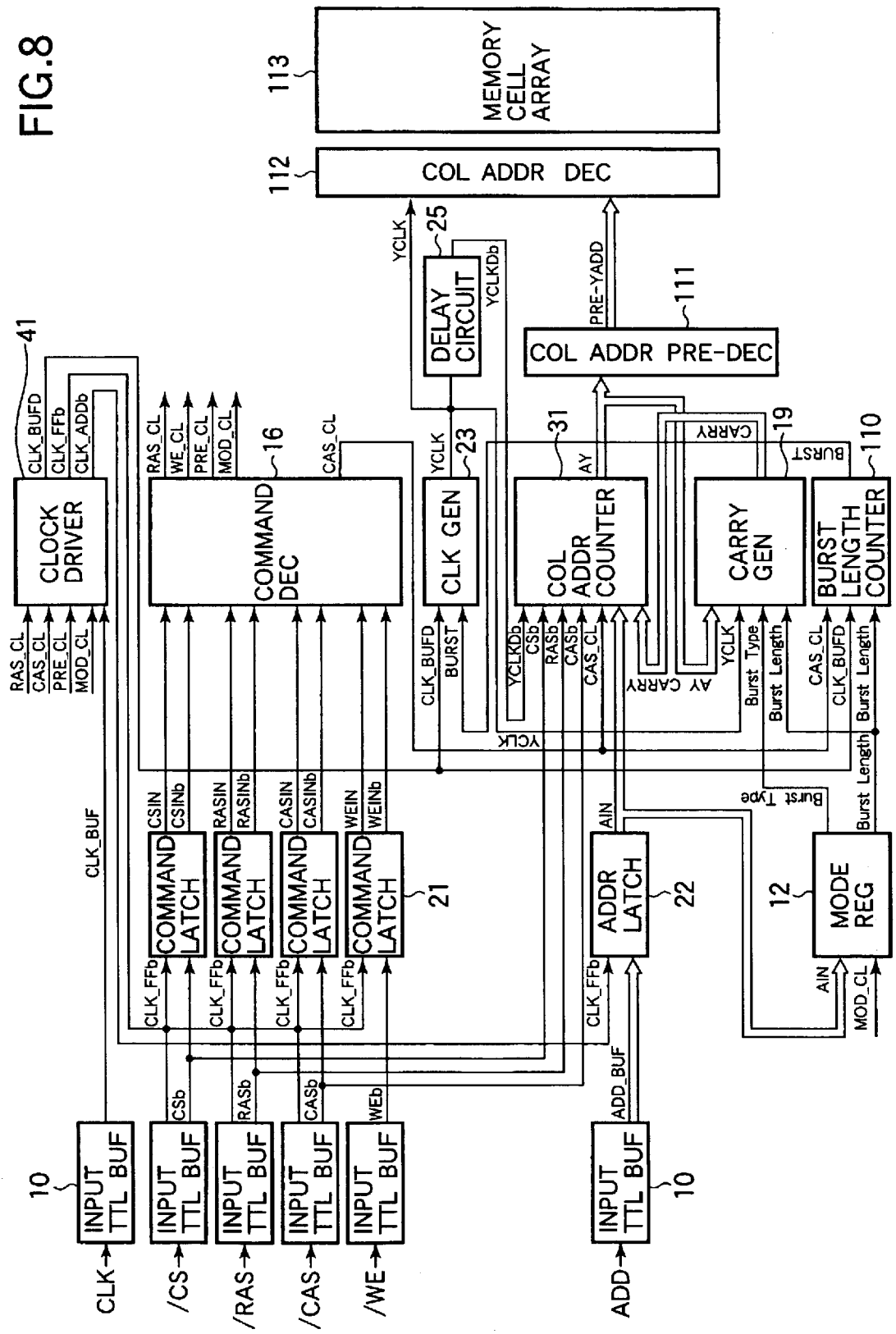
FIG. 8 is a block diagram of an SDRAM according to a third embodiment of the invention.

FIG. 8 shows the structure of an SDRAM according to the, third embodiment of the invention, using the same reference characters as in FIG. 6 for similar elements, mainly showing the structure of the circuits that generate a column address selection signal from an externally input address signal, and omitting the circuits that generate a row address selection signal and perform data input and output.

The SDRAM in the third embodiment in FIG. 8 has six input TTL buffers 10, a mode register 12, a command decoder 16, a carry generator 19, four command latch circuits 21, an address latch circuit 22, a column address control clock generator 23, a timing control delay circuit 25 for timing control, a column address counter 31, a clock driver 41, a burst length counter 110, a column address pre-decoder 111, a column address decoder 112, and a memory cell array 113.

The differences from the SDRAM in the second embodiment (FIG. 6) are that the clock driver 13 of the second embodiment is replaced with a clock driver 41 that receives control signals RAS__CL, PRE__CL, MOD__CL and CAS__CL from the command decoder 16 and outputs a clock signal CLK__ADDb, instead of clock signal CLK__FFb, to the address latch circuit 22.

The clock driver 41 receives clock signal CLK__BUF from the CLK input TTL buffer 10, outputs clock signal CLK__BUFD to the column address control clock generator 23 and the burst length counter 110, outputs clock signal CLK__FFb to the command latch circuit 21, generates clock signal CLK__ADDb, and outputs clock signal CLK__ADDb to the address latch circuit 22. Clock signal CLK__ADDb is activated only at the beginning of a specific operating mode.

Figure 9:
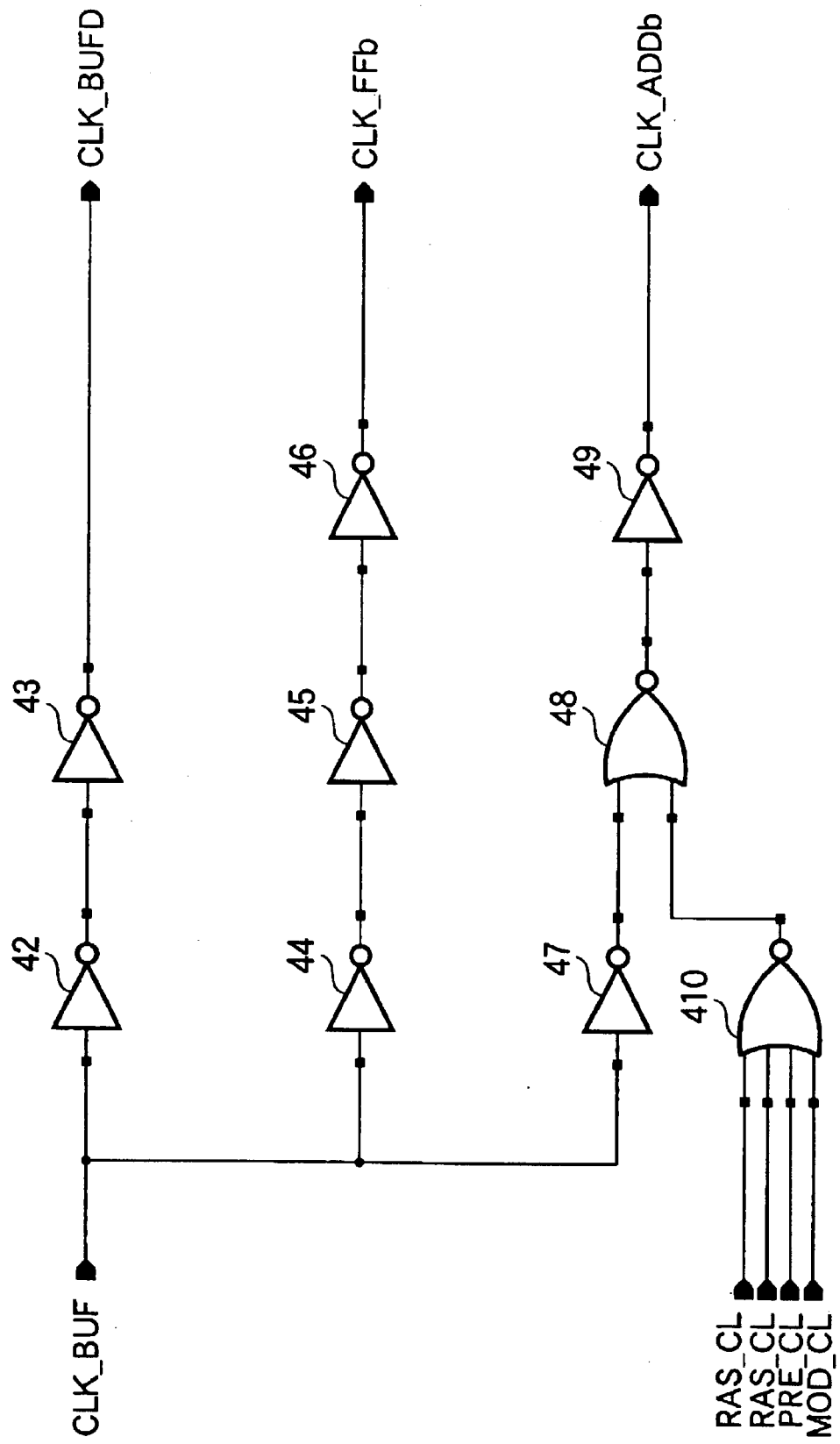
FIG. 9 is a circuit diagram of the clock driver in FIG. 8.

FIG. 9 shows the internal structure of the clock driver 41. The clock driver 41 comprises inverters 42, 43, 44, 45, 46, 47, 49, and a pair of NOR gates 48, 410.

The clock driver 41 in the third embodiment shown in FIG. 9 differs from the clock driver 13 in the second embodiment by including a circuit for generating clock signal CLK_ADDb. The circuit for generating clock signal CLK_ADDb comprises inverters 47 and 49 and the NOR gates 48 and 410.

Inverters 42 and 43 invert clock signal CLK_BUF from the CLK input TTL buffer 10, and output a clock signal CLK_BUFD; inverters 44, 45, and 46 invert clock signal CLK_BUF from the CLK input TTL buffer 10, and output a clock signal CLK_FFb.

NOR gate 410 receives control signals RAS_CL, PRE_CL, MOD_CL, and CAS_CL from the command decoder 16, takes their negated logical OR, and outputs the result to the first input terminal of NOR gate 48. The logic transitions of these signals occur when a new operating mode begins.

Inverter 47 inverts clock signal CLK_BUF. The second input terminal of NOR gate 48 receives the inverted version of clock signal CLK_BUF from inverter 47.

NOR gate 48 takes the negated logical OR of the inverted CLK_BUF clock signal and the negated logical OR of the RAS_CL, PRE_CL, MOD_CL and CAS_CL control signals. The result is inverted by inverter 49 and output as clock signal CLK_ADDb from the clock driver 41 for input to the address latch circuit 22.

In the third embodiment, in the clock signal CLK_ADDb input to the address latch circuit 22 from the clock driver 41, CLK_ADDb clock pulses are output only at the beginning of a specific mode. More specifically, CLK_ADDb clock pulses are output only when an address signal ADD is input at the beginning of a burst access.

Accordingly, the differential latch DFF2 in the address latch circuit 22 (FIG. 3) performs latch operations only at the start of a specific operating mode (only during the period in which the input of the externally input address signal ADD takes place at the start of a burst access). The differential latch DFF2 does not perform needless latch operations during the remainder of that operating mode (during a burst access while the column address signal is being generated internally) and in the active standby mode. As a result, current consumption is reduced as compared with the second embodiment.

As described above, in the third embodiment, the clock driver 41 generates a clock signal CLK_ADDb in which clock pulses are output only during the period of input of the externally input address signal ADD, and operates the differential latch DFF2 in the address latch circuit 22 by this clock signal CLK_ADDb, thereby reducing current consumption in the active standby mode during the period of internal generation of column address signals in a burst access.

The SDRAM in the third embodiment is derived from the second embodiment by replacing clock driver 13 with clock driver 41, but clock driver 13 can also be replaced with clock driver 41 in the first embodiment.

The first, second, and third embodiments have dealt with the circuits that generate a column address selection signal in an SDRAM, but the invention can also be applied to the circuits that generate another type of address selection signal, such as a row address selection signal, and to other types of semiconductor memory devices.

As described above, the invention has the effect of generating an address selection signal quickly, thus enabling high-speed access, including the first access in a burst.

Those skilled in the art will recognize that further variations are possible within the scope of the invention, which is defined by the appended claims.

What is claimed is:

1. A method of generating an address selection signal in a synchronous semiconductor memory device receiving a clock signal and an address signal, comprising:
    outputting the received address signal directly as a first internal address signal, output of the first internal address signal starting asynchronously with respect to the received clock signal;
    generating a second internal address signal from the received address signal in synchronization with the received clock signal; and
    generating the address selection signal first from the first internal address signal, then from the second internal address signal.

2. The method of claim 1, further comprising:
    receiving a command signal;
    outputting the received command signal directly as a first internal command signal, output of the first internal command signal starting asynchronously with respect to the received clock signal;
    generating a second internal command signal from the received command signal and the received clock signal, output of the second internal command signal being synchronized with the received clock signal; and
    selecting the first and second internal address signals according to the first and second internal command signals.

3. The method of claim 1, further comprising:
    generating an internal clock signal from the received clock signal while the address signal is being received;
    latching the received address signal in synchronization with the internal clock signal; and
    inactivating the internal clock signal when the address signal is not being received.

4. The method of claim 1, further comprising:
    generating a first control clock signal from the received clock signal, the first control clock signal being used to generate the address selection signal from the first and second internal address signals; and
    generating a second control clock signal by delaying and inverting the first control clock signal, the second control clock signal being used to generate the second internal address signal.

5. The method of claim 1, wherein outputting the received address signal comprises passing the received address signal through a first switching element on a first path.

6. The method of claim 5, wherein generating the second internal address signal comprises:
    latching the received address signal; and
    passing the latched address signal through a second switching element on a second path.

7. The method of claim 6, wherein generating the address selection signal comprises:
    switching the first switching element on and the second switching element off;
    outputting the received address signal from the first path as the first internal address signal;
    switching the first switching element off and the second switching element on in synchronization with the received clock signal; and
    outputting the latched address signal from the second path as the second internal address signal.

8. An address selection circuit for generating an address selection signal to select an address in a memory cell array in a synchronous semiconductor memory device, comprising:

a clock input circuit for receiving a clock signal;

an address input circuit for receiving an address signal, having a first path for direct output of the received address signal and a second path for latched output of the received address signal, the address signal being output on the first path until a first edge of the clock signal occurs while the address signal is being received, the address signal being latched on the first edge of the clock signal, the latched address signal being output on the second path from the first edge of the clock signal until a second edge of the clock signal occurs after reception of the address signal has ended;

an address generator for generating an internal address signal from the address signal output by the address input circuit; and an address decoder for generating the address selection signal by decoding the internal address signal.

9. The address selection circuit of claim 8, wherein the address generator receives the address signal from the address input circuit, outputs the received address signal directly on a third path to the address decoder as the internal address signal, generates a further internal address signal from the received address signal, and outputs the further internal address signal on a fourth path to the address decoder in synchronization with the clock signal.

10. The address selection circuit of claim 8, wherein the clock input circuit generates an internal clock signal, the internal clock signal being generated only while the address signal is being received, and the address input circuit latches the received address signal according to the internal clock signal.

11. The address selection circuit of claim 1, wherein the second path in the address input circuit includes a differential latch for latching the received address signal.

12. The address selection circuit of claim 8, further comprising:

a control clock generator for generating a first control clock signal from the clock signal received by the clock input circuit; and a delay circuit for generating a second control clock signal by delaying and inverting the first control clock signal;

wherein the address decoder operates in synchronization with the first control clock signal and the address generator operates in synchronization with the second control clock signal.

13. A synchronous semiconductor memory device including the address selection circuit of claim 8.

14. An address selection circuit for generating an address selection signal to select an address in a memory cell array in a synchronous semiconductor memory device, comprising:

a clock input circuit for receiving a clock signal;

an address input circuit for receiving an address signal;

an address generator for receiving the address signal from the address input circuit, outputting the received address signal directly on a first path as a first internal address signal, generating a second internal address signal from the received address signal, and outputting the second internal address signal on a second path in synchronization with the clock signal; and an address decoder for generating the address selection signal by decoding the first and second internal address signals.

15. The address selection circuit of claim 14, wherein the address input circuit has a third path for direct output of the received address signal and a fourth path for latched output of the received address signal, the address signal being output to the address generator on the third path until a first edge of the clock signal occurs while the address signal is being received, the address signal being latched on the first edge of the clock signal, the latched address signal being output to the address generator on the fourth path from the first edge of the clock signal until a second edge of the clock signal occurs after reception of the address signal has ended.

16. The address selection circuit of claim 14, further comprising:

a command input circuit for receiving a command signal, having a fifth path for direct output of the received command signal and a sixth path for latched output of the received command signal, the command signal being output on the fifth path until a third edge of the clock signal occurs while the command signal is being received, the command signal being latched on the third edge of the clock signal, the latched command signal being output on the sixth path from the third edge of the clock signal until a fourth edge of the clock signal occurs after reception of the command signal has ended; and a command decoder for generating an internal command signal by decoding the command signal output by the command input circuit.

17. The address selection circuit of claim 16, wherein the address generator has a circuit for opening and closing the first and second paths according to the internal command signal.

18. The address selection circuit of claim 16, wherein the sixth path in the command input circuit includes a differential latch for latching the received command signal.

19. The address selection circuit of claim 14, further comprising:

a control clock generator for generating a first control clock signal from the clock signal received by the clock input circuit; and a delay circuit for generating a second control clock signal by delaying and inverting the first control clock signal;

wherein the address decoder operates in synchronization with the first control clock signal and the address generator operates in synchronization with the second control clock signal.

20. A synchronous semiconductor memory device including the address selection circuit of claim 14.

* * * * *